US007085824B2

(12) United States Patent
Forth et al.

(10) Patent No.: US 7,085,824 B2
(45) Date of Patent: Aug. 1, 2006

(54) SYSTEMS FOR IN THE FIELD CONFIGURATION OF INTELLIGENT ELECTRONIC DEVICES

(75) Inventors: J. Bradford Forth, Victoria (CA); Jordon M. Dagg, Victoria (CA); Martin A. Hancock, Victoria (CA); Markus F. Hirschbold, Victoria (CA); Geoffrey T. Hyatt, Victoria (CA); Simon H. Lightbody, Victoria (CA)

(73) Assignee: Power Measurement Ltd., British Columbia (CA)

( * ) Notice: Subject to any disclaimer, the term of this patent is extended or adjusted under 35 U.S.C. 154(b) by 799 days.

(21) Appl. No.: 09/792,701

(22) Filed: Feb. 23, 2001

(65) Prior Publication Data

US 2002/0120723 A1 Aug. 29, 2002

(51) Int. Cl.
*G06F 15/177* (2006.01)
(52) U.S. Cl. .................. 709/221; 709/220; 709/222; 709/223; 709/228; 717/11
(58) Field of Classification Search ........ 709/220–223, 709/228; 717/11
See application file for complete search history.

(56) References Cited

U.S. PATENT DOCUMENTS

| | | | |
|---|---|---|---|
| 4,589,075 A | 5/1986 | Buennagel | 364/492 |
| 5,627,759 A | 5/1997 | Bearden et al. | 364/483 |
| 5,897,607 A | 4/1999 | Jenney et al. | |
| 5,995,911 A | 11/1999 | Hart | |
| 6,088,659 A * | 7/2000 | Kelley et al. | 702/62 |
| 6,182,170 B1 * | 1/2001 | Lee et al. | 710/65 |
| 6,199,068 B1 | 3/2001 | Carpenter | |
| 6,687,698 B1 * | 2/2004 | Nixon et al. | 707/10 |
| 6,801,920 B1 * | 10/2004 | Wischinski | 707/203 |
| 2002/0046246 A1 * | 4/2002 | Wright et al. | 709/206 |
| 2002/0091784 A1 * | 7/2002 | Baker et al. | 709/208 |
| 2003/0061335 A1 * | 3/2003 | Thomas et al. | 709/223 |

OTHER PUBLICATIONS

Dranetz-BMI, Signature System Basics, "Here's How Signature System Works . . . " pp. 1-2, http://www/signaturesystem.com/ sigbasics.html, Copyright 1997, 1998, 1999, 2000 Dranetz-BMI.

Dranetz-BMI. Signature System Infonodes, "Communication Options," pp. 1-2, http://www.signaturesystem.com/infonode.html, Copyright 1997, 1998, 1999, 2000 Dranetz-BMI.

G.E. Power Management, enerVista.com, Utility Enterprise Management, pp. 1-8, http://www.serv02.enervista.com/enervista.pdf, from brochure Printed in Canada enerVista.com 1t.qrk Jan. 30, 2001.

(Continued)

*Primary Examiner*—Kim Huynh
*Assistant Examiner*—Eron Sorrell
(74) *Attorney, Agent, or Firm*—Brinks Hofer Gilson & Lione

(57) ABSTRACT

A system for modifying the functionality of intelligent electronic devices installed and operating in the field is disclosed. Each of the intelligent electronic devices operates with a software configuration to monitor electrical energy. A copy of the software configurations may be maintained in a database. Changes to the operation of one or more of the intelligent electronic devices may be made as a function of modifications to the database.

71 Claims, 12 Drawing Sheets

OTHER PUBLICATIONS

"GE Power Management enerVista.com opens window to a whole new world of web-enabled SCADA and substation management services," pp. 1-4, http://www.serv02.enervista.com/;nav/new/enerVista.pdf, Markham, ON, Sep. 6, 2000.

Engage Networks, Inc., "Internet Protocol Card for Revenue Meters," pp. 1-2. http://www.engagenet.com/datasheets/ipcard.pdr.

muNet, Inc. "WebGate Iris (Internet Residential Information System)," pp. 1 @ http://www.munet.com/MunetProductsIrisIndex.htm, "Products (copy)," pp. 1-3 @http://www.munet.com/MunetProductsIris.htm, "Preliminary Specifications" pp. 1-2 @ http://www.munet.com/MunetProductsIrisSpec.htm.

muNet, Inc. "WebGate Icis (Internet Commerical Information System)," pp. 1 @ http://www.munet.com/MunetProductsicisIndex.htm, "Products (WebGate ICIS Internet AMR Now)," pp. 1-2 @ http://www.munet.com/MunetProductsicis.htm, Products (WebGate ICIS Control Center Software), pp. 1-2 @ http://www.munet.com/MunetProductsicisSpec.htm.

muNet, Inc., "muNet Demonstrates End-to-End IP-Based Energy Management System at DistribuTECH," pp. 1-2 @http://www.munet.com/muNetNewPressReleases0205001.htm, Feb. 5, 2001.

muNet, Inc., muNet's WebGate IRIS Deployed for Utility Trials Across US, pp. 1-2 @http://www.munet.com/muNetNewPressReleases121300.htm, Dec. 13, 2000.

muNet, Inc., "muNet's WebGate System Finds a Home on the Internet," pp. 1-2 @http://www.munet.com/muNetNewPressReleases031899.htm, Mar. 18, 1999.

* cited by examiner

SYSTEMS FOR IN THE FIELD CONFIGURATION OF INTELLIGENT ELECTRONIC DEVICES

RELATED APPLICATIONS

The following co-pending and commonly assigned U.S. patent applications have been filed on the same date as the present application. These application relate to and further describe other aspects of the embodiments disclosed in the present application and are herein incorporated by reference.

U.S. patent application Ser. No. 09/791,340, "SYSTEM AND METHOD FOR MANUFACTURING AND CONFIGURING INTELLIGENT ELECTRONIC DEVICES TO ORDER", filed herewith.

U.S. patent application Ser. No. 09/791,421, "SYSTEMS FOR IMPROVED MONITORING ACCURACY OF INTELLIGENT ELECTRONIC DEVICES", filed herewith.

U.S. patent application Ser. No. 09/791,421, "MULTI-FEATURED POWER METER WITH FEATURE KEY", filed herewith.

BACKGROUND

1. Field of the Invention

This invention relates to systems for monitoring electrical energy in electrical distribution systems, and more particularly to systems for reconfiguring and upgrading the software configuration in previously installed and operating intelligent electronic devices.

2. Description of the Related Art

Monitoring of electrical energy by consumers and providers of electric power is a fundamental function within any electric power distribution system. Electrical energy may be monitored for purposes of usage, equipment performance and power quality. Electrical parameters that may be monitored include volts, amps, watts, vars, power factor, harmonics, kilowatt hours, kilovar hours and any other power related measurement parameters. Typically, measurement of the voltage and current at a location within the electric power distribution system may be used to determine the electrical parameters for electrical energy flowing through that location.

Devices that perform monitoring of electrical energy may be electro-mechanical devices, such as, for example, a residential billing meter or may be intelligent electronic devices ("IED"). Intelligent electronic devices typically include some form of a processor. In general, the processor is capable of using the measured voltage and current to derive the measurement parameters. The processor operates based on a software configuration.

The software configuration is typically instruction sets stored in the intelligent electronic device. The instruction sets may be software, firmware or some other form of operating code and includes device specific data used to configure a particular intelligent electronic device. The software configuration of an intelligent electronic device is used during monitoring of the electrical energy and the derivation of measured parameters. Typically, the software configuration of an intelligent electronic device is determined during manufacturing. Following installation of the intelligent electronic device in the field, additional site-specific data may be entered to complete or modify the configuration based on the operational functionality desired.

A typical consumer or supplier of electrical energy may have many intelligent electronic devices installed and operating throughout their operations. The intelligent electronic devices may operate individually, or may operate as part of a monitoring system. Each of the intelligent electronic devices may require unique software configurations, or multiple devices may include the same software configuration.

In the prior art, modification of the software configuration of previously installed and operating devices may be a tedious and labor-intensive task. Prior art intelligent electronic devices are reconfigured individually. Individual reconfiguration may involve manually inputting data and instruction sets into the device at the site where device is installed (e.g., in the field). Similarly, in those prior art devices that include remote communication via a modem, each intelligent electronic device must be individually contacted and changes to the configuration initiated via the modem connection. Where it is desirable to revise the software configuration of a large number of intelligent electronic devices, the length of time required to perform the revisions greatly increases. Further, maintaining a record of the current software configuration of an intelligent electronic device may be difficult. Accordingly, a need exists for systems capable of performing efficient modification of the software configuration of multiple intelligent electronic devices and maintaining a record of the current software configurations.

BRIEF SUMMARY

The present invention is defined by the following claims, and nothing in this section should be taken as a limitation on those claims. By way of introduction, the preferred embodiments described below include a system for modification of the software configuration of field-installed intelligent electronic devices. As used herein, the term "field"should be construed to mean the site where the intelligent electronic device is installed and operates to monitor electrical energy following purchase by a user.

An intelligent electronic device (IED) is operated with a software configuration. A copy of the software configuration is maintained in a database. The database is accessible with a network. The intelligent electronic device may communicate over the network. A server or other central processing unit (CPU) in communication with the intelligent electronic device and the database is also coupled with the network. The server provides a virtual meter site where modifications to the functionality of the intelligent electronic device may be performed over the network using the database. Modifications performed at the server may be packaged as an update and transferred over the network to one or more of the intelligent electronic devices in an automated fashion. The updates received by the intelligent electronic devices may be applied to the software configuration currently operating in the intelligent electronic devices.

One embodiment describes a method of modifying the operation of an intelligent electronic device installed in the field. The method comprises operating the intelligent electronic device with a software configuration to monitor electrical energy. The method further comprises accessing a virtual meter site via a network and selecting modifications for the software configuration with the virtual meter site. In addition, the method comprises revising the software configuration with the virtual meter site as a function of the selected modifications.

Another embodiment describes a method of modifying the configuration of an intelligent electronic device installed in the field. The method comprises operating the intelligent electronic device with a first software configuration to monitor electrical energy. In addition, the method comprises communicating over a network to modify a copy of the first software configuration stored in a database and generating a first software revision as a function of the modification. The method further comprises initiating the transfer of the first software revision over the network to the intelligent electronic device and updating the first software configuration with the first software revision to create a second software configuration. In addition, the method comprises operating the intelligent electronic device with the second software configuration to monitor electrical energy.

Yet another embodiment describes a method of modifying the functionality of a plurality of intelligent electronic devices installed and operating in the field. The method comprises accessing a virtual meter site via a network and specifying an identifier for the intelligent electronic devices. The method further comprises initiating the creation of an update to a software configuration of each of the intelligent electronic devices with the virtual meter site and transferring the update to the intelligent electronic devices over the network. In addition, the method comprises modifying the software configuration in each of the intelligent electronic devices with the update.

A method of adding functionality to an intelligent electronic device installed and operating in the field is described by another embodiment. The method comprises specifying functionality to be added to the intelligent electronic device with a user interface and selecting payment for the functionality using the user interface. The method further comprises upgrading the functionality of the intelligent electronic device.

Another embodiment describes a method of maintaining the integrity of data collection in an intelligent electronic device operating in the field to monitor electrical energy. The method comprises operating a first intelligent electronic device and a second intelligent electronic device at a location to monitor electrical energy. The method further comprises transferring data collected by the first intelligent electronic device over a network to a database and terminating the operation of the first intelligent electronic device to perform maintenance of the first intelligent electronic device. In addition, the method comprises activating the first intelligent electronic device following the maintenance to monitor electrical energy at the location and transferring data collected by the second intelligent electronic device to the database. Further, the method comprises transferring data from the first intelligent electronic device and data from the second intelligent electronic device over the network from the database to the first intelligent electronic device.

A system for modifying the functionality of an intelligent electronic device previously installed in the field and operating is disclosed by another embodiment. The system comprises a server computer, an intelligent electronic device and a storage device. The intelligent electronic device is in communication with the server over the network. The intelligent electronic device is operated with a software configuration stored therein. The storage device is also in communication with the server. The data storage device comprises a database. A copy of the software configuration is stored in the database. The server modifies the operation of the intelligent electronic device as a function of modifications to the database.

Further aspects and advantages of the invention are discussed below in conjunction with the preferred embodiments.

DETAILED DESCRIPTION OF THE PREFERRED EMBODIMENTS

The presently preferred embodiments disclose a system for performing modification of the software configuration of intelligent electronic devices that are installed in the field. The modification may be performed on an individual intelligent electronic device. In addition, groups of intelligent electronic devices may be identified for modification. Further, a copy of the software configuration of the intelligent electronic devices may be maintained in a database. Upgrades or changes to the software configuration of an intelligent electronic device may be performed with the database followed by transfer of the changes to the intelligent electronic device. Conversely, changes at the intelligent electronic device may be transferred to the database.

Figure 1:
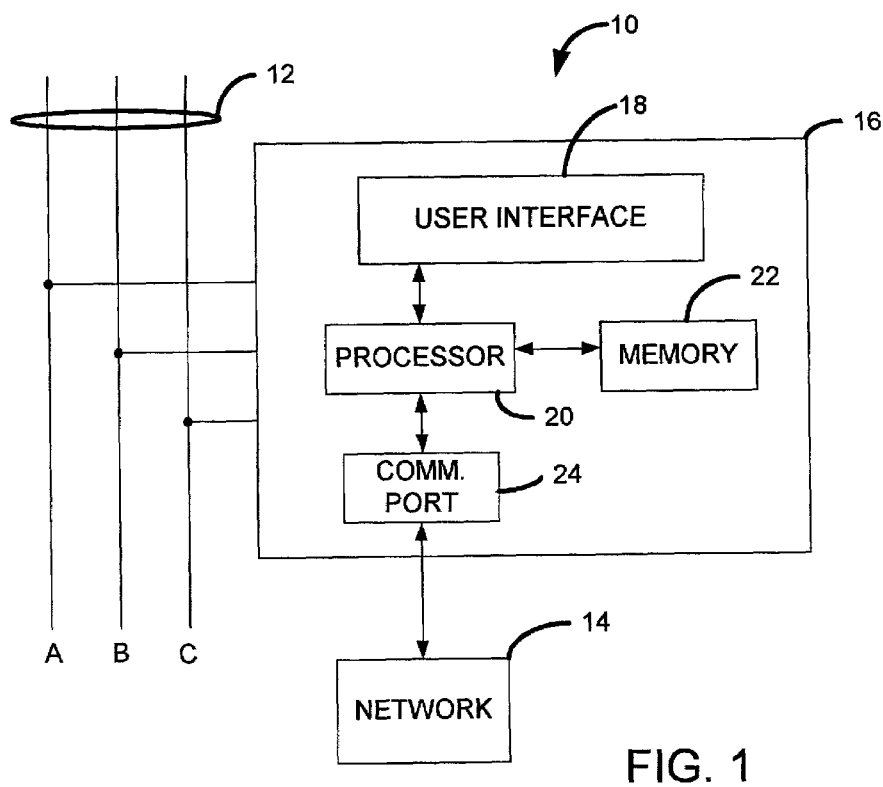
FIG. 1 is a block diagram of a portion of a power distribution system that includes one embodiment of an intelligent electronic device.

FIG. 1 illustrates a block diagram representation of an embodiment of a portion of a power distribution system 10. The power distribution system 10 includes a plurality of conductors 12, a network 14 and at least one intelligent electronic device (IED) 16. The conductors 12 and the network 14 may be connected with the IED 16 as illustrated. As used herein, the term "connected" or "coupled" may mean electrically connected, optically coupled or any other form of coupling allowing the flow of data, electricity or some representation thereof between devices and components that are connected or coupled. The conductors 12 may be, for example, electric transmission lines, electric distribution lines, power cables, bus duct or any other material capable of conducting electrical energy. The conductors 12 are operable to allow the flow of electrical energy therethrough. The conductors 12 are illustratively depicted in FIG. 1 in a three-phase circuit configuration; however the phase configuration is not limited to three-phases.

The network 14 may be the Internet, a public or private intranet, an extranet, or any other network configuration to enable transfer of data and commands. An example network configuration uses the Transport Control Protocol/Internet Protocol ("TCP/IP") network protocol suite, however, other Internet Protocol based networks are contemplated. Communications may also include IP tunneling protocols such as those that allow virtual private networks coupling multiple intranets or extranets together via the Internet. The network 14 may support application protocols, such as, for example, telnet, POP3, Mime, HTTP, HTTPS, PPP, TCP/IP, SMTP, proprietary protocols, or any other network protocols known in the art. During operation, the IED 16 may communicate using the network 14 as will be hereinafter discussed.

The IED 16 may be a programmable logic controller (PLC), a remote terminal unit (RTU), an electronic power meter, a protective relay, a fault recorder or other similar intelligent device installed in the field and capable of monitoring electrical energy. In addition, the IED 16 may perform other functions such as, for example, power distribution system protection, management of power generation, management of energy distribution and management of energy consumption. In one embodiment, the IED 16 includes a user interface 18, a processor 20, a memory 22 and a communication port 24 connected as illustrated in FIG. 1. It will be appreciated that the IED 16 may include other hardware components such as, for example, metering sensors, power supplies, signal processing circuits, logic circuits or any other hardware useful in performing electrical energy monitoring. As used herein, the term "IED" may be used interchangeably with the term "IEDs." For example, the term "IED" may be used to discuss aspects involving one IED 16 and "IEDs" may be used to discuss aspects involving multiple IEDs 16.

During operation of the power distribution system 10, the IED 16 monitors the electrical energy flowing within the conductors 12. The IED 16 may process the electrical energy to derive, store and display data for various electrical parameters indicative of the electrical energy flowing in the conductors 12. The IED 16 may also provide outputs to, and receive inputs from, the power distribution system 10. Processing within the IED 16 may be performed with a software configuration. As will be hereinafter described, the software configuration within the IED 16 may be modified remotely without removing the IED 16 from service. In addition, the software configuration may be modified locally using the user interface 18.

The user interface 18 may include one or more buttons, levers, switches, display screens, keypads, touch screens or any other device(s) capable of providing an interface to a user of the IED 16. As illustrated in FIG. 1, the user interface 18 is connected with, and acts as an interface to, the processor 20. As such, the user interface 18 may provide display of the electrical parameters derived by the processor 20. In addition, commands for the processor 20 may be entered using the user interface 18.

The processor 20 may be, for example, a microprocessor, an electronic control unit or any other device capable of executing instructions, monitoring electrical inputs and providing electrical outputs. The processor 20 may perform calculations, operations and other logic related tasks to operate the IED 16. In one embodiment, the processor 20 may operate as a function of the software configuration. The software configuration may be stored in the memory 22 connected with the processor 20. The processor 20 and the memory 22 cooperatively operate to form the central processing unit (CPU) for the IED 16.

The memory 22 may be a non-volatile memory, such as for example a flash memory device or other similar memory storage device in communication with the processor 20. The memory 22 may store the electrical parameters derived by the IED 16 during operation. The memory 22 may also store the software configuration of the IED 16. In addition, the memory 22 may be used to store other information pertaining to the functionality or operation of the IED 16 or the network 14.

In another embodiment, the memory 22 may include both non-volatile memory and volatile memory. The memory 22 may store a first portion of the software configuration in the non-volatile memory and a second portion of the software configuration in volatile memory. In this embodiment, the volatile memory may be is used to limit the amount of more costly non-volatile memory required. The first portion of the software configuration may include instructions that instruct the IED 16 to retrieve the second portion of the software configuration from another location. As such, when power is applied to activate the IED 16, the instructions in the non-volatile memory are executed and the remaining software configuration is transferred from the remote location (as later discussed) to the non-volatile memory.

In the presently preferred embodiments, the software configuration includes firmware software and applications software. Firmware is the low level operating code providing the basic functionality, or operating capability of the IED 16. The firmware may be referred to as an operating system of the IED 16. The firmware may include standard as well as optional components to support the basic functions of the IED 16.

The applications software may include one or more software programs designed to derive, display, utilize and manipulate the data within the IED 16. Applications software may include measurement and recording applications, derivation applications, measurement and control applications, communications applications and any other applications providing functionality to the IED 16. The applications software may also include standard applications software and custom applications software. Standard applications software includes those applications developed by the manufacturer that may be provided as standard functionality within the IED 16. Standard applications software typically performs the more usual and customary functions for which the IED 16 is designed.

Custom applications software includes those applications specifically tailored to the needs of an end user, or group of end users operating the IED 16 in the field. Any applications software that is not "off the shelf" software may be considered custom applications software. Custom applications software may be developed by the end users, third parties or by the manufacturer of the IED 16.

In the one embodiment, the applications software may be organizationally described as a plurality of frameworks. The frameworks may be an object oriented software architecture allowing the organization of the various operations performed by the IED 16. Accordingly, each of the frameworks in a software configuration may represent one or more parts of the applications software. For example, a framework identified as a setpoint framework may contain operating instructions for the IED 16 pertaining to setpoints for the various electrical parameters derived by the IED 16. Other exemplary frameworks may include, a historic data logging framework, a harmonic measurement framework, a display framework, a digital inputs framework, an alarm framework, a revenue framework or any other framework representing some portion of the functionality of the IED 16.

The software configuration of this embodiment may be comprised of the firmware and the frameworks. The frameworks may represent both applications software, referred to as "Core" frameworks, and custom applications software, referred to as "Custom" frameworks. Accordingly, the IED 16 is a highly customizable device capable of performing a wide variety of monitoring and power management functions. While the IED 16 may utilize the object oriented framework architecture, it will be appreciated that the applications software may also be developed in non-object oriented format and still provide a highly customizable device.

Each of the frameworks of one embodiment includes a plurality of modules. The modules may operate within an object oriented software construct known as an integrated object network (ION™) that will be hereinafter discussed. Development of a framework may be accomplished by linking several modules together. The modules may represent logic tasks performed to manipulate, derive, store, transfer or otherwise process data. The data input to the modules may be received by the framework from data inputs to the IED 16, or may be the data output from another framework. An IED 16 may have several frameworks operating independently or in combination with other frameworks to perform various management, control, derivation, storage communication and/or other functions of the IED 16. In one embodiment, the frameworks may be created in a software design tool called "ION™ Designer." "ION™ Designer" is a component of a PEGASYSTM software system manufactured by Power Measurement Ltd., located in Saanichton, B.C., Canada.

Figure 2:
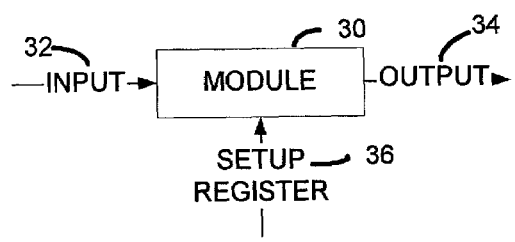
FIG. 2 depicts an exemplary embodiment of a module operating within the intelligent electronic device illustrated in FIG. 1.

FIG. 2 depicts an example of a module 30 operating within a framework (not shown) of the IED 16 (FIG. 1). The module 30 includes at least one input 32, at least one output 34 and at least one setup register input 36. The quantity and signal type of the inputs 32, the outputs 34 and the setup register inputs 36 are dependent on the function of the module 30. The setup register inputs 36 may include configuration settings for the module 30. The configuration settings determine how the module 30 processes the data received on the inputs 32 and generates data on the outputs 34.

The module 30 may be designated to perform any of a number of functions within one of the frameworks. For example, the module 30 may be an Arithmetic Module that performs mathematical and logical functions such as multiplication, addition, square root, etc. to data supplied on the inputs 32 and provides the result on the outputs 34. Further examples may include a Display Module that allows for the creation of custom front panel display screens and a Sag/Swell Module that monitors the voltage inputs for disturbances and, upon detection of a disturbance, breaks the disturbance into discrete components to perform a more detailed analysis. Further exemplary modules of one embodiment may be found in an "ION™ Reference Manual", printed by Power Measurement Ltd., located in Saanichton, B.C., Canada.

Figure 3:
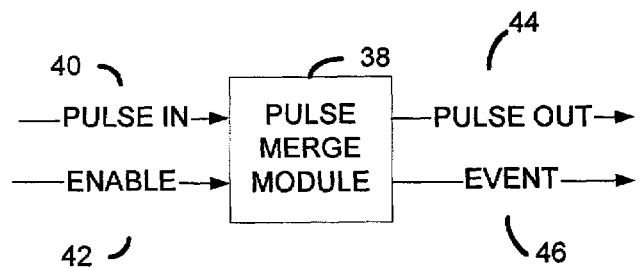
FIG. 3 depicts another exemplary embodiment of a module operating within the intelligent electronic device illustrated in FIG. 1.

FIG. 3 is an exemplary embodiment of a Pulse Merge (PM) Module 38 operating within a framework (not shown) of the IED 16 (FIG. 1). The PM module 38 receives at least one pulse input signal on at least one pulse input line 40. The pulse input signals may be from an external input (not shown) to the IED 16, or from one or more other modules (not shown). The PM module 38 may commence with processing the pulse input signals upon receipt of an enable signal on an enable line 42. Following processing, the PM module 38 may provide at least one pulse output signal on at least one pulse output line 44. The pulse output signals may be an input to another module within the frameworks or may be an external output from the IED 16. The processing of the pulse input signals may be functions such as, for example, an AND, OR, NOT, or any other Boolean function. In addition, the PM module 38 may further process the pulse output signals to generate an event output signal on an event output line 46. The event output signal may, for example, be written to an event log or trigger further processing in the IED 16. In this embodiment, the PM module 38 does not require configuration settings and therefore no setup register lines are included.

Figure 4:
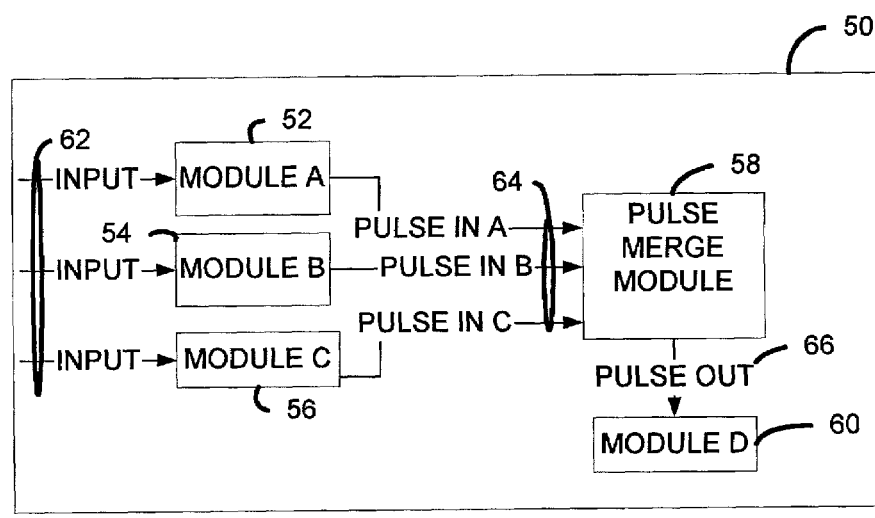
FIG. 4 depicts an exemplary embodiment of a framework that includes the modules depicted in FIGS. 2 and 3.

FIG. 4 is an exemplary embodiment of a portion of a framework 50 within the IED 16 (FIG. 1). The framework 50 includes a Module A 52, a Module B 54, a Module C 56, a Pulse Merge (PM) Module 58 and a Module D 60 that are connected as illustrated. The Modules A–D 52, 54, 56, 58 are similar to the module 30 previously discussed with reference to FIG. 2. In addition, the PM Module 58 is similar to the PM module 38 previously discussed with reference to FIG. 3.

In the exemplary embodiment, Modules A, B and C 52, 54, 56 may be Maximum Modules each configured to monitor an input line 62 for input signals. During operation, if one of the input signals reaches a pre-set value, the corresponding Module 52, 54, 56 may output an output pulse signal on a corresponding output line 64. The PM module 58 may monitor the output lines 64, and upon receipt of one of the output pulse signals may generate an output pulse signal on an output pulse line 66. Module D 60 may monitor the output pulse line 66. Module D 60 may be an Alert Module configured to provide an electrical signal alerting that a maximum value has been reached. It should be realized that the above-described exemplary embodiment is merely one example of a portion of one framework and numerous other frameworks as well as module configurations are possible.

In the presently preferred embodiments, the frameworks may utilize the data generated by other frameworks within the IED 16, or external signals provided to the IED 16, to produce useful results and/or perform useful functions. Frameworks ultimately create and allow manipulation of the functionality of the IED 16. The ease of creation and manipulation permits, as well as promotes, customization and expansion of the IED 16. As such, the functionality of the IED 16 may be modified by simply changing or adding frameworks to the device.

The highly customizable and configurable nature of the IED 16 lends itself to solutions satisfying the specific needs of a user's power management applications. However, this requires the user of the IED 16 to configure and tailor the frameworks to their needs. It would be impractical for the manufacturer to offer every conceivable combination of options and software. Further, the capabilities of the IED 16 make it almost impossible to predict the functionality desired by each user. It is therefore desirable to provide a system through which a customer can customize, edit and update the software configuration of one or more IEDs 16 that are previously installed and operating in the field.

The IEDs 16 may also include an identifier to uniquely identify each of a plurality of IEDs 16 (not shown). Alternatively, the identifier may uniquely identify a predetermined group of IEDs 16. Further, an IED 16 may include a number of identifiers both for unique identification as well as for any number of predetermined groups. The identifiers may, for example, be an identification number, such as, a serial number or a part number. Alternatively, the identifiers may be letters, numbers or a combination of both. The manufacturer may determine the identifiers for an IED 16 or a predetermined group of IEDs 16. Alternatively, a user may develop identifiers following installation in the field.

Referring again to FIG. 1, the IED 16 also includes the communication port 24. The communication port 24 may be, for example, an Ethernet card, a network interface card or some other network compatible communication device capable of creating a communication link. In addition, the communication port 24 may include wireless communication capability, such as, for example, a wireless transceiver (not shown). The communication port 24 may operatively cooperate with the processor 20 to format and pass commands and information. The IED 16 may send and receive data and commands using transfer protocols, such as, for example, file transfer protocols (FTP), Simple Object Access Protocol (SOAP), Extensible Markup Language (XML) or any other protocols know in the art.

The communication port 24 of one embodiment allows the IED 16 to be a node on the network 14. The IED 14 communicates with other nodes on the network 14. The other nodes on the network 14 may be other network devices such as, another IED 16, a server, or any other central processing unit (CPU) operable to communicate over the network 14. As such, the IED 16 is capable of peer-to-peer communication with other IEDs 16 as well as communication with other CPUs communicatively coupled with the network 14.

Figure 5:
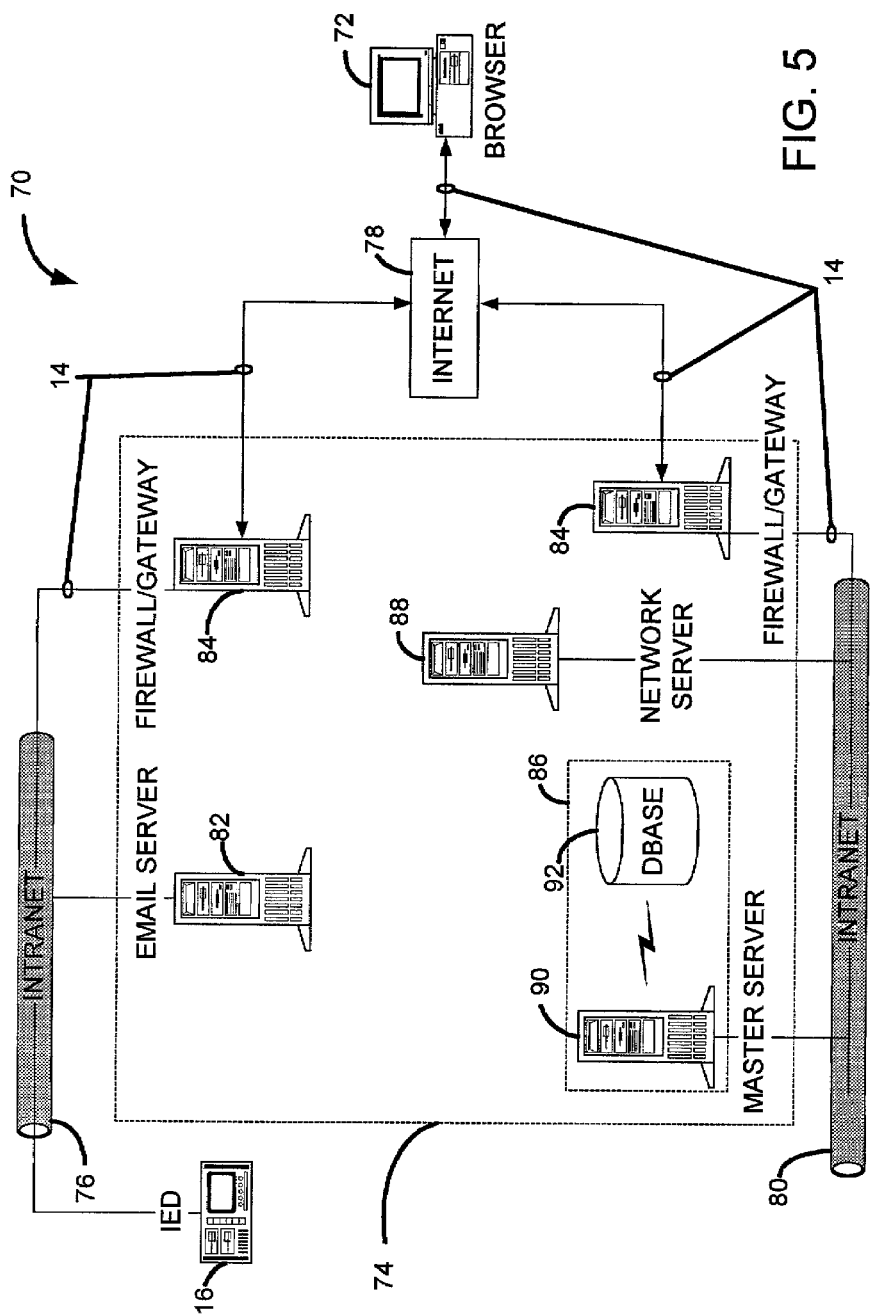
FIG. 5 is a block diagram of one embodiment of a portion of a network distribution system that includes the intelligent electronic device illustrated in FIG. 1.

FIG. 5 illustrates a portion of one embodiment of a network distribution system 70. The network distribution system 70 includes at least one IED 16, at least one browser 72 and a plurality of servers 74 forming nodes on the network 14. The nodes are connected and operatively communicating with each other over the network 14 as illustrated. In the illustrated exemplary network distribution system 70, the network 14 includes components of a first intranet 76, an Internet 78 and a second intranet 80. Communication within network 14 may be performed with a communication medium that is included in wireline based communication systems and/or wireless based communication systems. The communication medium may be for example, a communication channel, radio waves, microwave, wire transmissions, fiber optic transmissions, or any other communication medium capable of transmitting data in wireline and wireless based communication systems.

The number and configuration of the components forming the network 14 are merely an illustrative example, and should not be construed as a limitation on the almost unlimited possibilities for configuration of the network 14. In addition, hardware within the network 14 may perform one or more of the functions described herein, as well as other well-known network functions, and therefore should not be construed as limited to the configuration described. For example the function performed by the servers 74 are illustratively described as different servers for purposes of clarity, however a single server, or more than one server may perform the functions of the servers 74. Further, the general form of the architecture is connectionless thereby allowing for substantially simultaneous communications between a substantial number of devices, such as, for example, multiple IEDs 16 and browsers 72 within the network distribution system 70. This form of scalability eclipses architectures that utilize point-to-point connections, such as, for example, those provided by telephony networks where a limited number of simultaneous communications may take place.

In the embodiment illustrated in FIG. 5, the IED 16 may communicate via the first intranet 76. As generally known in the art, intranets are comprised of software applications and various computing devices (network cards, cables, hubs, routers, etc.) that are used to interconnect various computing devices and provide a communication path. The term "intranet," as used herein, should be broadly construed to include any and all hardware and software applications that allow the IEDs 16, the browser 72, the servers 74 and other computing devices to be communicatively coupled to share and transfer data and commands. Intranets are not limited to a particular physical location and may include multiple organizations using various communication protocols. Although not illustrated, other devices, such as, for example, printers may be connected with the intranet 76, 80 to make these devices available to users of the network 14. As known in the art, various types of intranets 76, 80 exist and may be used with the presently preferred embodiments.

The browser 72 may be any application running on a CPU that is capable of communicating over the network 14. The browser 72 may be an Internet browser, proprietary software or any other application capable of forming a connection with the servers 74 to send and receive information. In addition, the browser 72 may be capable of sending data to, and receiving data from, the IED 16. The browser 72 may include an intranet, a server or any other devices and applications discussed herein to interface with and communicate via the Internet 78.

The servers 74 are the primary interface to clients, such as, for example, the IED 16 and the browser 72, for all interactions with the applications or services available within the network distribution system 70. The servers 74 may operate to authenticate the clients, establish a secure connection from the clients to the servers 74, and allow applications the clients are using to transparently access other resources of the network distribution system 70. In another embodiment, the IED 16 may perform some or all of the functions of the servers 74. In the exemplary embodiment, the servers 74 include at least one email server 82, a plurality of firewall/gateway servers 84, at least one master server 86 and a network server 88. The master server 86 further comprises a master server machine 90 and a database 92 in operable communication with each other. In other embodiments, additional servers, fewer servers or an individual server may be used to fulfill these functions.

The email server 82 may be any CPU that includes associated communications hardware and an application capable of handling incoming and outgoing mail for the first intranet 76. An example embodiment is a computer that operates with Single Mail Transfer Protocol (SMTP) and Post Office Protocol 3 (POP3) using applications, such as, for example, MICROSOFT WINDOWS NT and MICROSOFT EXCHANGE SERVER. The email server 82 communicates over the network 14 using the first intranet 76.

The firewall/gateway servers 84 may be a CPU that provides a network interfacing function, an application launching function and a firewall function. In the network interfacing function, the firewall/gateway servers 84 may be responsible for controlling traffic on the intranet 76, 80 and the interface with the Internet 78. In addition, the firewall/gateway servers 84 may include applications that can be launched by users of the intranet 76, 80 and the Internet 78. An example traffic controlling function is accepting incoming HTTP (Hypertext Transfer Protocol) messages and fulfilling the requests embedded therein. Another example would be receiving dynamic HTML (Hypertext Markup Language) page generation requests and launching the appropriate applications to fulfill those requests. Other transfer protocols, such as file transfer protocols (FTP), Simple Object Access Protocol (SOAP), Extensible Markup Language (XML) or other protocols known in the art may also be controlled by the firewall/gateway servers 84.

In the application launching function, the firewall/gateway servers 84 may include applications to manage the logical flow of data and commands and keep track of the state of sessions. A session is a period of time in which the IED 16 or the browser 72 is interacting with, and using the network distribution system 70. Other applications operating within the firewall/gateway servers 84 may include encryption and decryption software. Exemplary encryption and decryption software encrypts commands transmitted across the network 14, and decrypts data received from the network distribution system 70. In one embodiment, encryption may be done utilizing Pretty Good Privacy (PGP). PGP uses a variation of public key system, where each user has a publicly known encryption key and a private key known only to that user. The public key system and infrastructure enables users of unsecured networks, such as the Internet 78, to securely and privately exchange data through the use of public and private cryptographic key pairs.

Authentication applications may also be included in the firewall/gateway servers 84. Authentication applications may be performed for commands or data sent or received over the network 14. Authentication is the process of determining and verifying whether the device transmitting data or commands is the device it declares itself to be. In addition, authentication prevents fraudulent substitution of devices or spoofing of device data generation in an attempt to defraud. Parameters such as time/date stamps, digital certificates, physical locating algorithms such as cellular triangulation, serial or tracking ID's, which could include geographic location such as longitude and latitude may be parameters included in authentication. Authentication may also minimize data collection and control errors within the network distribution system 70 by verifying that data is being generated and that the appropriate devices are receiving commands.

The firewall function performs network security by isolating internal systems from unwanted intruders. In the example embodiment, the firewall/gateway server 84 for the first intranet 76 may isolate the IED 16, the email server 82 and the firewall/gateway server 84 from all Internet traffic that is not relevant to the operation of the network distribution system 70. In this example, the only requests allowed through the firewall may be for services pertaining to the IED 16, the email server 82 and the firewall/gateway server 84. All requests not validated and pertaining to the IED 16, the email server 82 and the firewall/gateway server 84 that are received from the Internet 78 may be blocked by the firewall/gateway server 84.

As used herein, the term Internet 78 should be broadly construed to include any software application and hardware device that is used to connect the IED 16, the browser 72 and the servers 74 with an Internet service provider (not illustrated). The Internet service provider may establish the connection to the Internet 78. The IED 16, the browser 72 and the servers 74 may establish a connection to the Internet 78 with the Internet service provider using, for example, modems, cable modems, ISDN connections and devices, DSL connections and devices, fiber optic connections and devices, satellite connections and devices, wireless connections and devices, Bluetooth connections and devices, two-way pagers or any other communication interface device. For the purpose of the presently preferred embodiments, it is important to understand that the IED 16, the browser 72 and the servers 74 may operatively communicate with one another through the Internet 78.

The master server machine 90 of the master server 86 may be any CPU in communication with the database 92. The master server machine 90 runs applications that store, maintain and allow interface to the data within the database 92. Applications, such as, for example, a database management system (DBMS) or other similar application may organize and coordinate the storage and retrieval of data from the database 92. The database 92 may be stored in a storage device, such as, for example, at least one hard drive, an optical storage media, or any other data storage device allowing read/write access to the data. The data in the database 92 may be communicated by the master server machine 90 throughout the network distribution system 70 using the network 14. The data within the master server 86 may be centralized on one master server 86 or may be distributed among multiple master servers 86 that are distributed within the network distribution system 70.

In one embodiment of the master server 86, the database 92 may include one or more datafiles that include frameworks. In addition, the database 92 may include one or more datafiles that include software configurations. As previously discussed, the software configuration may include both firmware and frameworks. The database may also include characteristic curves for each of the IEDs 16 as disclosed in U.S. patent application entitled SYSTEMS FOR IMPROVED MONITORING ACCURACY OF INTELLIGENT ELECTRONIC DEVICES Ser. No. 09/792,699 filed on Feb. 23, 2001, now U.S. Pat. No. 6,671,635, which is herein incorporated by reference in its entirety. The frameworks, software configurations and characteristic curves may be represented by individual datafiles, contained as groups within a plurality of datafiles or all contained in a single datafile in the database 92.

The database 92 may also include a second portion of the software configuration for one or more of the IEDs 16. In this embodiment, the second portion of the software configuration may be transferred at the request of the corresponding IED 16. As previously discussed, the memory 22 (FIG. 1) of the IED 16 may include volatile and non-volatile portions. As such, the second portion of the software configuration may be transferred from the database 92 and stored in the volatile memory when the IED 16 is activated and the first portion of the software configuration stored in the non-volatile memory is executed. In operation this enables an IED 16 to have minimal amounts of software configurations stored in non-volatile memory. Upon initial startup of the IED 16, the remainder of the software configuration may be loaded into the volatile memory. For example, an IED 16 may have a minimum amount of software that includes a boot file stored in the non-volatile portion of memory by the manufacturer of the IED 16. The boot file may include instructions for the IED 16 to contact the manufacturer, retrieve and store the remainder of the software configuration in volatile memory and execute the entire software configuration to operate the IED 16.

The frameworks and software configurations stored in the database 92 may be associated with one or more of the IEDs 16 by one or more identifiers. The identifiers may identify, for example, frameworks or software configurations that may be used for a group of the IEDs 16, such as, for example, a particular model of the IEDs 16. Alternatively, the frameworks or software configurations may be associated with a particular IED 16. As such, each of the IEDs 16 previously installed in the field may have a copy of the currently operating software configuration stored in the database 92.

The database 92 may be accessed to perform changes, additions, upgrades, patches or any other type of modification to the copy of the existing software configuration operating in one or more of the IEDs 16. The database 92 may be accessed by the IED 16 and the browser 72 via the network 14 as will be hereinafter 45 discussed. Access to the database 92 may allow the selection of one or more of the datafiles for a particular IED 16 or group of IEDs 16. The datafiles may be selected from the database 92 as a function of the identifier. Prior to allowing access to the database 92, the master server 86 may perform verification. Verification ensures that requestor has the authority to access the datafiles being requested. The verification could be in the form of a password, entry of the identifier or any other technique for verifying authorization. Requests to access the database 92 may be made using the network server 88.

The network server 88 may be any CPU running applications for use within the network distribution system 70. In one embodiment, the network server 88 operates an application that forms an interface. The interface may be referred to as a virtual meter site. The virtual meter site provides an interface for a user to access and manipulate the software configuration of an IED 16 that is already operating in the field. In one embodiment, the IED 16, the browser 72 or the master server 86, may access the network server 88 using the network 14. It will be appreciated that there may be many alternative methods of accessing and manipulating the software configurations, both manual and automated, and all such methods are contemplated.

The virtual meter site operated by the network server 88 is preferably implemented as an Internet, intranet or extranet accessible sire. The virtual meter site may be a secure site requiring customers to register or log in for access. Alternatively, the virtual meter site may be implemented as an electronic mail interface, as will be hereinafter discussed. Further, the virtual meter site may be implemented using telephony-based services such as automated telephone or operator assisted interfaces or facsimile based interfaces. A similar interface is disclosed in U.S. patent application Ser. No. 09/791,340 filed on Feb. 23, 2001, now U.S. Pat. No. 6,853,978, entitled SYSTEM AND METHOD FOR MANUFACTURING AND CONFIGURING INTELLIGENT ELECTRONIC DEVICES TO ORDER, which is herein incorporated by reference in its entirety.

The network server 88 may provide functionality for a user of one or more IEDs 16 to access the database 92 using the virtual meter site. The datafiles within the database 92 may be displayed by the virtual meter site and modified by the user. In addition, the network server 88 may request the corresponding software configuration from the currently operating IED 16 that corresponds to the datafile being displayed. The network server 88 may perform verification that the software configuration in the datafile matches the software configuration currently operating in the IED 16. In an another embodiment, the master server 86 may perform the verification. Where the software configurations do not match, the user may be prompted to continue or end the modification session. If the user opts to continue, the user may have the opportunity to reconcile the differences by updating one or more of the datafiles. Where the software configurations do match, the user may perform modification of the datafile.

In one embodiment, modification of one or more selected datafiles may be performed at the direction of the user using display pages. The display pages may provide a selection list such as, for example, pull-down menus, pick lists or text entry fields to perform the modifications. All modifications may be performed on copies of the software configurations stored in the database 92. For example, a user wishing to change an alarm setpoint in a group of IEDs 16 may select the identifier for the group. That part of the software configuration common to the group would display on the virtual meter site. The user may then select the alarm setpoint and enter the new value. The new value may be stored in datafiles representing the software configuration for each of the IEDs 16 in the group.

In another embodiment, the network server 88 operates the virtual meter site using interactive pages capable of processing and applying a users request. In this embodiment, the network server 88 includes one or more configuration applications capable of analyzing the copy of the software configuration of one or more operating IEDs 16 based on the identifier. The configuration application performs an assessment, such as through an interactive hierarchical series of interrogatories presented via a display page, to determine the needs of the particular user. Once the needs are assessed, the configuration application adds the appropriate framework or modifies an existing framework to include additional functionality specified by the user.

The modifications and additions are performed on the copy of the datafile(s) containing the software configuration of one or more IEDs 16 already in operation in the field. For example, a user specifies a group of IEDs 16 and requests an upgrade in functionality to include detection and measurement of harmonics. The configuration application analyzes the software configurations of each of the IEDs 16 in the group and modifies the existing frameworks to implement the upgrade. Implementation among the IEDs 16 in the group may vary depending on the existing functionality of the IEDs 16. For example some of the IEDs 16 may need an additional framework, while others merely need modification of an existing framework.

In yet another embodiment, a modification to an existing software configuration may be selected from a selection list(s) of previously stored software configuration upgrades listed in the virtual meter site. The previously stored software configurations may be publicly available to any user or may be exclusive to a particular user or group of users. For example, where a user selects an identifier for a predetermined group of IEDs 16, a list would be available of previously stored software configurations for that identified group. The user may select a configuration and request an upgrade of the group.

Access to a software design tool is available over the network 14 in another embodiment. The software design tool may be accessed and utilized through the network server 88 to create and modify the frameworks during modification of a datafile. An exemplary software design tool is the ION™ Designer software design tool. As in the previous embodiments, modifications may be made to copies of the software configuration in the database 92.

Other procedures for modification of the functionality of the IEDs 16 are contemplated such as, for example, the ability for a user to select stored software configurations of one or more IEDs 16 and overwrite stored software configurations of one or more other IEDs 16. Another procedure may allow the manufacturer of the IEDs 16 to provide enhancement or repairs of the frameworks or firmware by modifications to the datafile of one or more of the IEDs 16.

The network server 88 may also maintain the financial accounting associated with modifications and upgrades to IEDs 16 previously installed in the field. Financial accounting may include, for example, providing pricing for various available upgrades, maintaining charge accounts for different users and providing methods of online payment. For example, where a user wishes to upgrade the software configuration of a group of IEDs 16 to include historical data logging, the network server 88 may determine the cost for the upgrade to each IED 16 and present a total price to the user. The IEDs 16, the network server 88, or a combination of both may supply pricing for the upgrade. Following selection of payment method and entry of billing information, the user may be allowed to, proceed with the transfer of the modification to the corresponding IEDs 16.

Methods of online payment may include, for example, pre-authorized payment structures that may further include user credit systems or authorized billing codes. Direct or pre-authorized payment plans may occur through an interface on the network server 88. Further, communication with other payment authorization services such as, for example, dial-up authorizations or other online credit-card networked servers may also be utilized to provide and authorize online payments. Exemplary well known payment authorization services include, for example, Visa™, MasterCard™, debit-cards, electronic payment cards or any other authentication systems for financial information. It may be appreciated that the actual billing authentication may take place independent of the browser 72 and network server 88. For example, the IED 16 may initiate contact with a server (not shown) performing payment authentication and, upon receipt of authentication, contact the network server 88 to transfer the billing data and the requested upgrade to the software configuration.

In the presently preferred embodiments, the master server 86 and the network server 88 may cooperatively operate to generate and transfer an update that includes the modifications. Alternatively, a server, or a plurality of servers performing some or all of the functions of the master server 86 and the network server 88 may generate and transfer an update. Following completion of the modifications to the datafile, the user may request the revised copy of the software configuration be stored in the database 92. Upon storage of the datafile, the master server 86 may be triggered to initiate the generation and transfer of the update. The network server 88 may be triggered to initiate the generation and transfer of the update by storage of the datafile. In addition, a command by the user, payment or any other user initiated triggering mechanism may initiate the generation and transfer of the update to the corresponding IEDs 16. In the previously discussed embodiments, the generation and transfer of an update to the software configuration of one or more IEDs 16 currently operating in the field is an automated process that may be initiated by activities of the user.

The master server 86, or the network server 88, may transfer updates that include the entire software configurations incorporating the modifications. Alternatively, the update may include only the modifications to the software configuration currently operating in the corresponding IEDs 16. Where the updates include only the modifications, a comparison of the modified datafile and the software configuration currently in operation in a corresponding IED 16 are compared to generate the update. The differences are packaged as the update and transferred to the corresponding IED 16.

In another embodiment the IED 16 may contain a software configuration that includes all, or a large part, of the functionality and features available for the IED 16. However, only functionality and features previously purchased by the user are currently operational in the IED 16. The remaining functionality and features may be disabled in the software configuration of the IED 16. A modification to the software configuration of this embodiment involves enabling those portions of the software configuration that correspond to the modification requested. Updates transferred to the IED 16 of this embodiment maybe a software key, an enabling code or any other enabling mechanism or technique for activating disabled functionality within the IED 16. The use of this type of enabling mechanism is disclosed in U.S. patent application Ser. No. 09/791,421 filed on Feb. 23, 2001 entitled MULTI-FEATURED POWER METHOD WITH FEATURE KEY, which is herein incorporated by reference in its entirety.

In this embodiment, the user, when ordering modifications or features for an IED 16, may be given the option of enabling the feature instead of uploading and installing the feature as previously described. This allows the user the flexibility of having faster access to additionally functionality within the IED 16. Faster access may take place since an update to enable a feature may take considerable less time to implement than an update that includes the entire software configuration or modifications to the existing software configuration. For example, when the IED 16 is prompted to enable a feature that is disabled, the IED 16, after processing the billing data as previously discussed, contacts the network server 88 to receive an update. It can be appreciated that transferring an update that includes only an enabling mechanism may be much less time consuming than uploading an entire modification or software configuration.

In another embodiment the IED 16 includes the software configuration and the enabling mechanism. As such, the user may, once the billing data is processed, have access to the enabling mechanism to enable the features without requiring the transfer of an update as previously described. It can be appreciated that the enabling mechanism may be in the form of a code that is displayed for the user to re-enter through the user interface to enable the feature, or may operate "behind the scenes" and automatically enable the feature once the billing data has been authorized.

In the previously described embodiments, updates for the IED 16 may be transferred via the network 14. In one embodiment, the use of email is the mechanism for transferring the update to the IED 16. The identifier associated with the update may also be associated with the email address of the particular IED 16. The master server 86 or network server 88 of this embodiment is capable of sending an email that includes the update. Since the update is transferred via email, the firewall/gateway server 84 for the IED 16 may require no additional configuration to allow the message to be delivered to the IED 16. Upon receipt of the email message, the email server 82 may forward the message to the identified IED 16. The IED 16 may extract and apply the update to the software configuration currently operating in the IED 16. The IED 16 may then store the updated software configuration. Alternatively, the email may include an executable that the IED 16 executes to extract, apply and store the update.

In another embodiment, the email server 82 is the designated recipient of the update. In this embodiment, the email server 82 is a translation device. The translation device includes an application that may extract the update from the email message and download the update to the IED 16 via the first intranet 76. In addition, the email server 82 may format the update prior to download.

In another embodiment, the update may be supplied in a data file from the master server 86 or the network server 88. In this embodiment, the firewall/gateway server 84 may be configured to allow the data file to pass through to the first intranet 76. The data file containing the update may be transferred to a designated recipient device, such as, for example, the browser 72, the firewall/gateway server 84 or some other translation device in communication with the network 14. The translation device may be compatible with the IED 16 and contain an application that functions to communicate with, and download the update to the IED 16 via the network 14. In another embodiment, the IED 16 may include capability to obtain or be assigned an IP address. In this embodiment, the data file may be transferred directly to the IED 16. Upon receipt, the IED 16 may translate the data file to a compatible format, store and begin operating with the update.

In yet another embodiment, a combination of e-mail and datafiles may be used to initiate the transfer. For example, the IED 16 may be contacted by an e-mail from the master server 86 or the network server 88. The e-mail message may indicate that an update has been generated. Following receipt of the e-mail, the IED 16 may retrieve the update in the form of a datafile from the master server 86 or the network server 88. Since an e-mail message is sent to the IED 16, and the IED 16 retrieves the datafile, the firewall/gateway server 84 may require no additional configuration.

Figure 6:
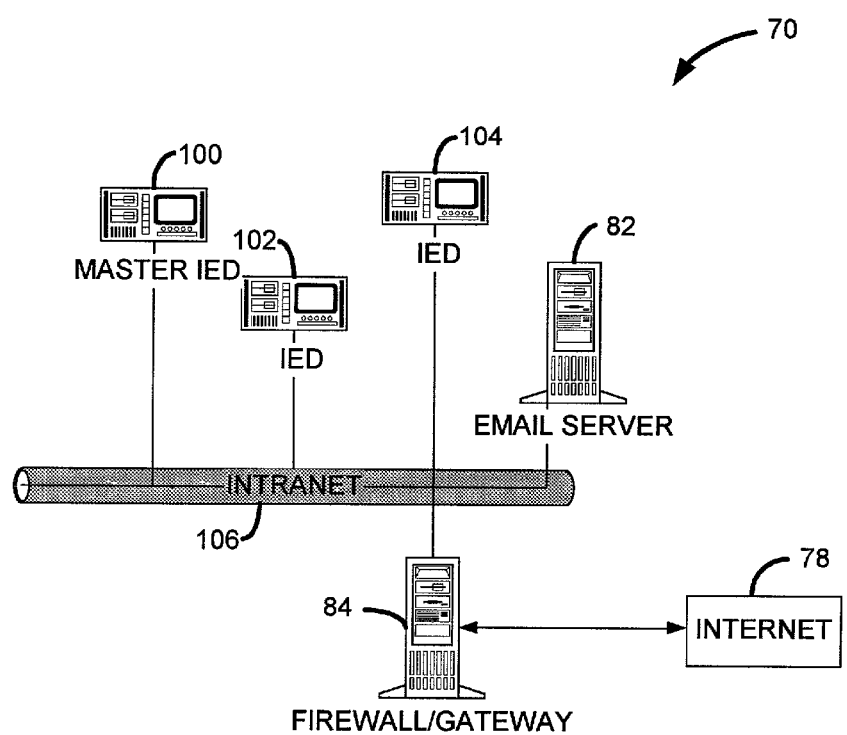
FIG. 6 is a block diagram of another embodiment of a portion of a network distribution system that includes the intelligent electronic device illustrated in FIG. 1.

FIG. 6 illustrates a portion of another embodiment of the network distribution system 70. The network distribution system 70 includes the email server 82, the firewall/gateway server 84, a master IED 100, a first IED 102 and a second IED 104 that operatively communicate over the Internet 78 and an intranet 106 as illustrated. In this embodiment, the master, first and second IEDs 100, 102, 104 may be physically located at the same location or may be dispersed among multiple locations.

The master IED 100 may be configured to communicate by email and/or data file transfer in the manner described by the previous embodiments. In addition, the master IED 100 may communicate with the first and second IED 102, 104 via the intranet 106. During operation, updates transferred to the master IED 100 include information identifying the final destination. The master IED 100 may use the information to route the updates to itself, the first IED 102 or the second IED 104. In addition, the master IED 100 may operate as a translation device to translate the update into a compatible format or otherwise "unpack" and reconfigure the update received. In this embodiment, the IEDs 100, 102, 104 may also communicate using peer-to-peer communications. One of the IEDs 100, 102, 104 may contain functionality that may be transferred to another one of the IEDs 100, 102, 104. For example, where the software configuration of the first IED 102 includes functionality not present in the second IED 104, the functionality may be transferred to the second IED 104. Similarly, an enabling mechanism present in the first IED 102 may be transferred to the second IED 104.

Referring now to FIGS. 1, 5 and 6, within the previously discussed embodiments, the IED 16, 100, 102, 104 may continuously monitor the electrical energy in the conductors 12 during the transfer and revision of the software configuration currently operating in the IED 16, 100, 102, 104. For purposes of the remainder of this discussion, the IED 16, 100, 102, 104 illustrated in FIGS. 1, 5 and 6 will hereinafter be referred to simply as IED 16 or IEDs 16 unless otherwise noted. During operation, the IED 16 may receive the update by one of the previously discussed techniques. The IED 16 may then create a new version of the software configuration as a function of the update while continuing to operate on the existing software configuration. When the new version of the software configuration is completed, the IED 16 may perform a "hot transfer" to instantaneously switch from the existing software configuration to the new version of the software configuration. As such, the IED 16 may continuously monitor the electrical energy. It should be recognized that data associated with derived parameters, or parameters subject to storage may be lost during the switch.

In another embodiment, one or more status messages may be supplied to the user during the transfer and revision of the software configuration currently operating in the IED 16. The status messages may provide ongoing status during the operation as well as indication that the upgrade was successful. In addition, upgrade or data transfer logging may occur within the IED 16, the master server 86 or the network server 88. The logging may allow the user to access a stored log of information regarding the status of update transfers and upgrades. For example, a user may specify a batch upgrade of several IED's 16. The upgrade status and error logging may be utilized to aid the user in confirming successful completion of, or errors within, the upgrade process in each of the IEDs 16.

In addition, the IED 16, the master server 86, or the network server 88 may allow for revision control. Revision control may include the capability to revert to the previously operating software configuration option. In addition, revision control may allow the user to manage, view and evaluate changes and discrepancies between new upgrades, existing configurations and previous configurations. The ability to revert to the previous software configuration may allow a user to view the previous configuration and switch the IED 16 to operation with the previous configuration if deemed necessary. Management of the changes and discrepancies may include identification of discrepancies, suggested fixes for the discrepancy as well as error identification within the software configuration.

Figure 7:
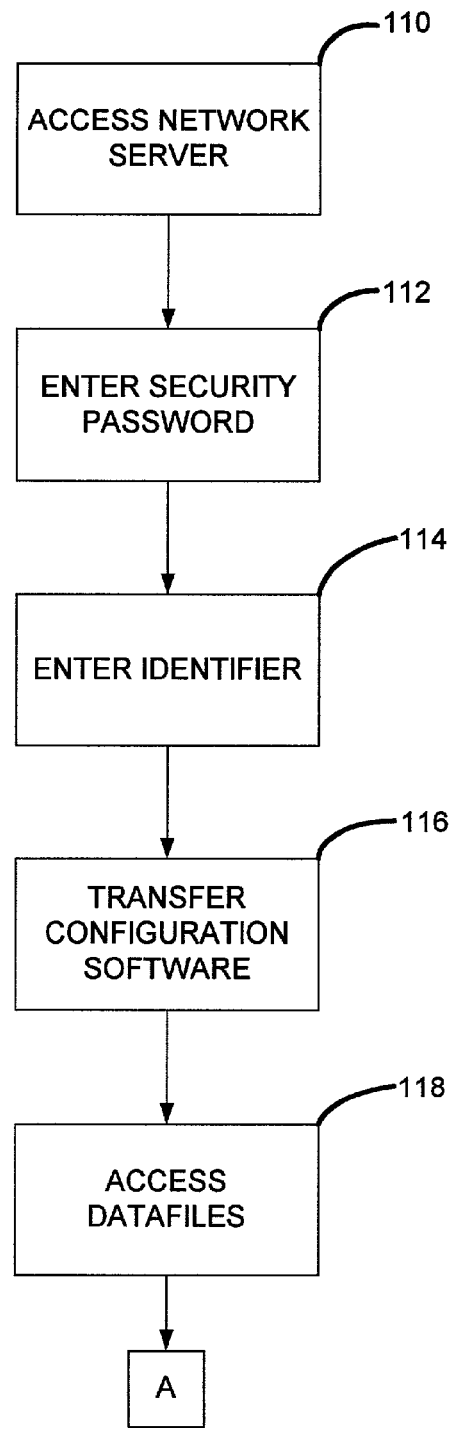
FIG. 7 is a first part of one embodiment of a flow diagram illustrating operation of the network distribution systems illustrated in FIGS. 5 and 6.

FIG. 7 is a flow diagram illustrating operation of one embodiment of the network distribution system 70. The operation will be described with reference to the devices identified in FIGS. 5 and 6. Operation begins with accessing the network server 88 via the network 14 at block 110. At block 112, a password or other security protection is entered to access the virtual meter site within the network server 88. The identifier for the IED 16 or group of IEDs 16 of interest is entered at block 114. At block 116, a copy of the software configuration currently in operation in the IED 16 or each of the IEDs 16 associated with the identifier is transferred to the network server 88. The datafiles from the database 92 are accessed by the network server 88 at block 118.

Figure 8:
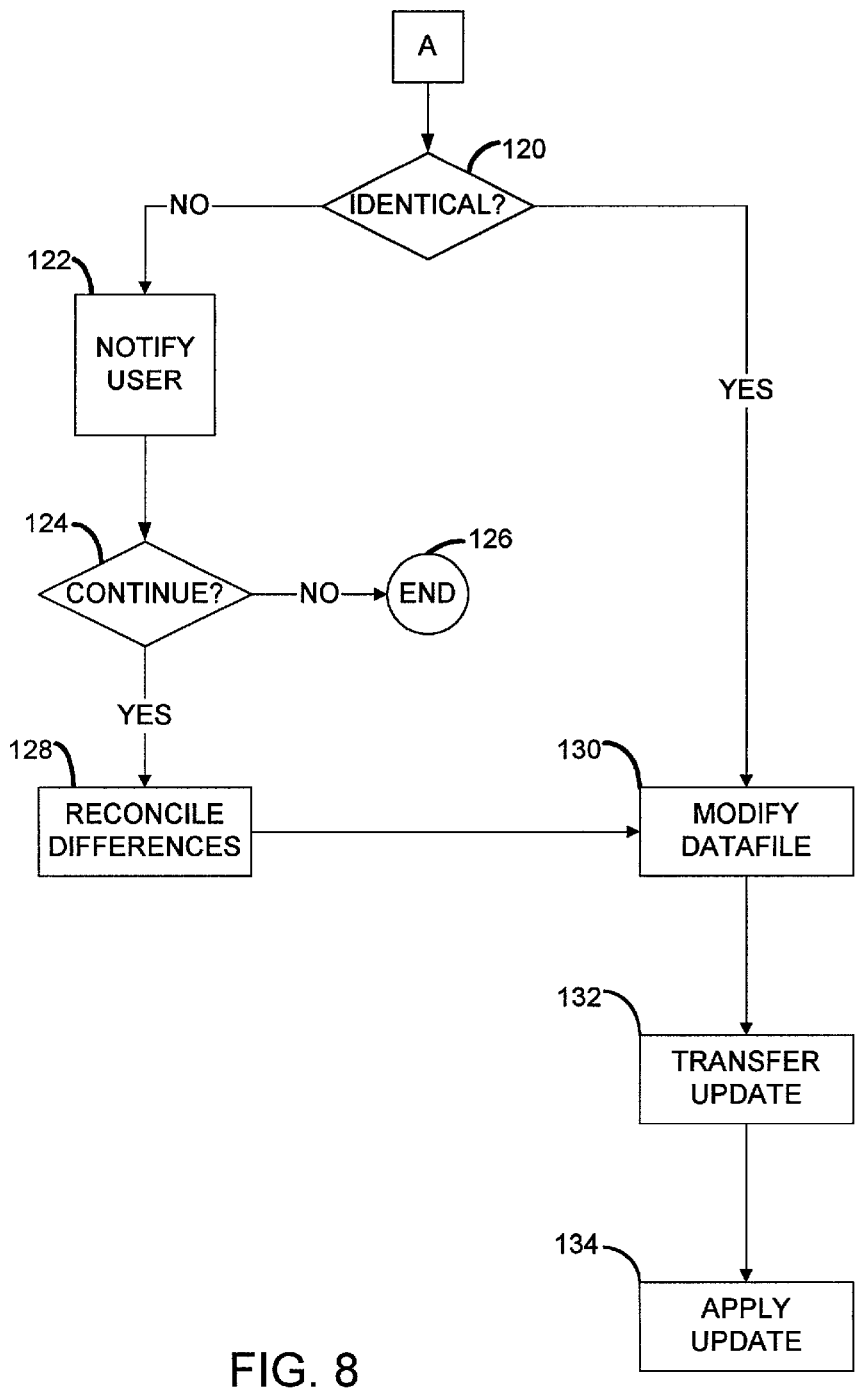
FIG. 8 is a second part of the flow diagram of FIG. 7.

Referring now to FIG. 8, at block 120, a comparison is made of the datafiles and the corresponding software configurations currently in operation to determine if they are identical. If the configurations are different, the user is notified at block 122 of differences. At block 124, the user is prompted to continue. If the user elects not to continue, the modification session ends at block 126. If the user elects to continue, reconciliation of the differences may be performed at block 128. At block 130, access to the datafiles is provided to allow modification. If the configurations were identical at block 120, access to the datafiles is provided to allow modification at block 130. At block 132, modifications are completed and storage and transfer of the update are initiated. The update is provided to a corresponding IED 16 at block 134. At block 136, the IED 16 applies the update and continues operation.

Referring again to FIGS. 5 and 6, in another embodiment, updates may be pulled from the master server 86 or the network server 88 by the IEDs 16. The IEDs 16 may be instructed to request updates on a predetermined schedule. In this embodiment, the IEDs 16 may be activated as a group, or individually, by the predetermined schedule to contact the master server 86 or the network server 88 and request any available updates. Upon receiving such a request, the data file may be compared to software configuration currently operating in the IED 16 as previously discussed. Where the datafile and the software configuration do not match, an update may be generated. The update may be retrieved by the IED 16, as a function of the identifier, in an automated fashion. Alternatively, the update may be generated and transferred by the master server 86 or the network server 88, as previously described.

In an another embodiment, the IEDs 16 may be activated to check for updates by an email message, instruction from the browser 72 or manual requests entered through the user interface 18 (FIG. 1).

In another embodiment, the IED 16 may include security measures as part of the update process. In this embodiment, when the IED 16 is contacted to accept an update, the IED may notify a system administrator of the pending update. The system administrator may be the owner of the IED 16 or some other individual overseeing operation. The IED 16 may notify the system administrator by an email message, an alarm message, a pulse output, a pager message or any other form of notification. The IED 16 may require some form of approval by the system administrator prior to accepting the update. The update may be received by the IED 16 and held without implementation until approval by the system administrator. In another embodiment, the IED 16 may be disabled by the system administrator from accepting updates.

The IED 16 of another embodiment may initiate the modification of the datafiles in the database 92. Modifications to the software configuration of the IED 16 may be performed manually using the user interface 18 (FIG. 1). Following completion of the modifications, the IED 16 may be triggered to contact the master server 86 using the network 14. The IED 16 may be triggered by the act of storing the modified software configuration, a user entered command or any other technique for triggering the transfer. The update to the software configuration may then be packaged by the IED 16 and transferred to the master server 86. The master server 86 may receive and apply the update to a datafile as a function of the identifier associated with the IED 16.

In yet another embodiment, the IED 16 may be used to initiate an upgrade to the software configuration currently operating in that IED 16. The upgrade may be, for example, to add additional functionality to the IED 16. To initiate the upgrade, a user may communicate with the network server 88 using the user interface 18 (FIG. 1). The user may select the desired upgrade from, for example, a list residing within the IED 16, or by interacting with the network server 88 as in the previously discussed embodiments.

Once the user has selected an upgrade, the network server 88 may retrieve the currently operating software configuration and provide pricing data to the IED 16. The user may be prompted by the IED 16 to provide billing information that may be transferred to the network server 88 by the IED 16. Following authentication of the billing information, the master server 86 or the network server 88 may initiate the creation of an update and subsequent transfer to the IED 16 as previously discussed. In one embodiment, the IED 16 may be activated by the network server 88 to request the update as previously discussed. In another embodiment, the upgrade may already exist in a disabled state within the software configuration. The upgrade may be enabled by the master server 86 or the network server 88 by transfer of a software key or other similar enabling technique, as previously discussed. Following completion of the upgrade, the network server 88 performs the financial accounting to bill the user.

Figure 9:
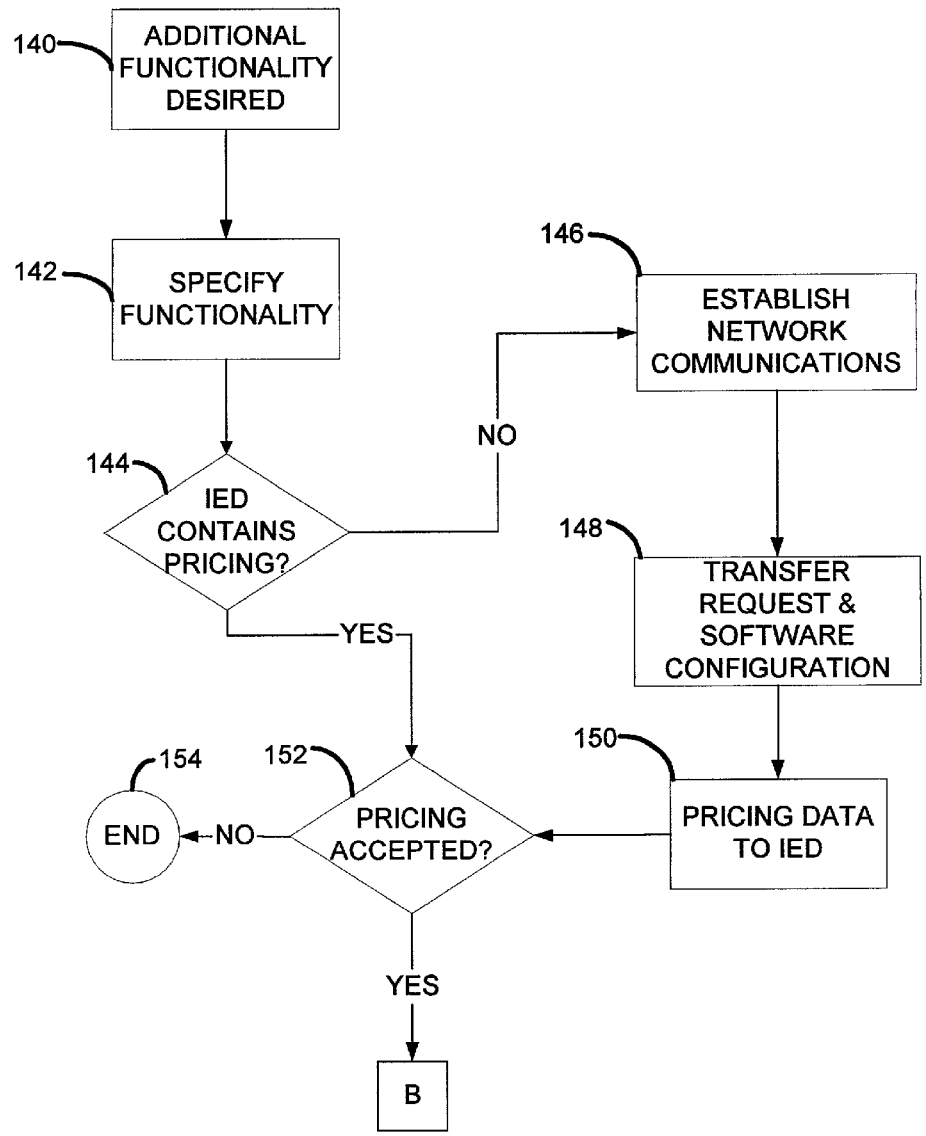
FIG. 9 is a first part of another embodiment of a flow diagram illustrating operation of the network distribution systems illustrated in FIGS. 5 and 6.

FIG. 9 is a flow diagram illustrating operation of the previously discussed embodiment where the user may upgrade a software configuration from the user interface 18 (FIG. 1) of a corresponding IED 16. The upgrade operation begins at block 140 where the user requires additional functionality within the IED 16. At block 142, a desired upgrade is specified. The IED 16 is checked to determine if the pricing is contained within the IED 16 at block 144.

If no pricing is found, the IED 16 may establish network communications with the network server 88 at block 146. At block 148, the upgrade request, a pricing request and the current software configuration operating in the IED 16 is transferred to the network server 88. The pricing data resulting from the request is transferred to the IED 16 at block 150. At block 152, the user is queried to accept the pricing on the upgrade. If it is determined at block 144 that the IED 16 contains pricing, the user is similarly queried to accept the pricing at block 152. If the user does not accept the pricing, the upgrade operation ends at block 154.

Figure 10:
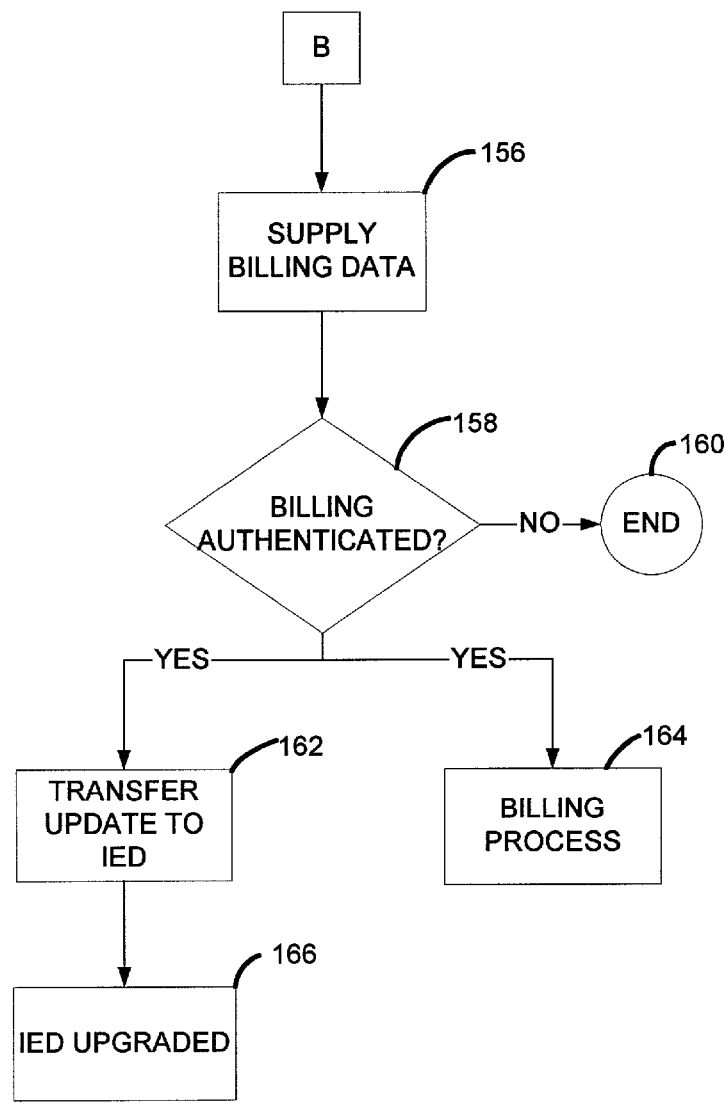
FIG. 10 is a second part of the flow diagram of FIG. 9.

Referring now to FIG. 10, if the user accepts the pricing at block 152, the user provides billing data that may be transferred to the network server 88, or some other payment authentication server as previously described at block 156. At block 158, authentication of the billing data occurs. If authentication fails, the upgrade operation ends at block 160. If the authentication is successful at block 158, the update may be transferred to the IED 16 at block 162. At the same time, the billing process is initiated at block 164. At block 166, the update is received, the IED 16 is upgraded and operation continues.

Figure 11:
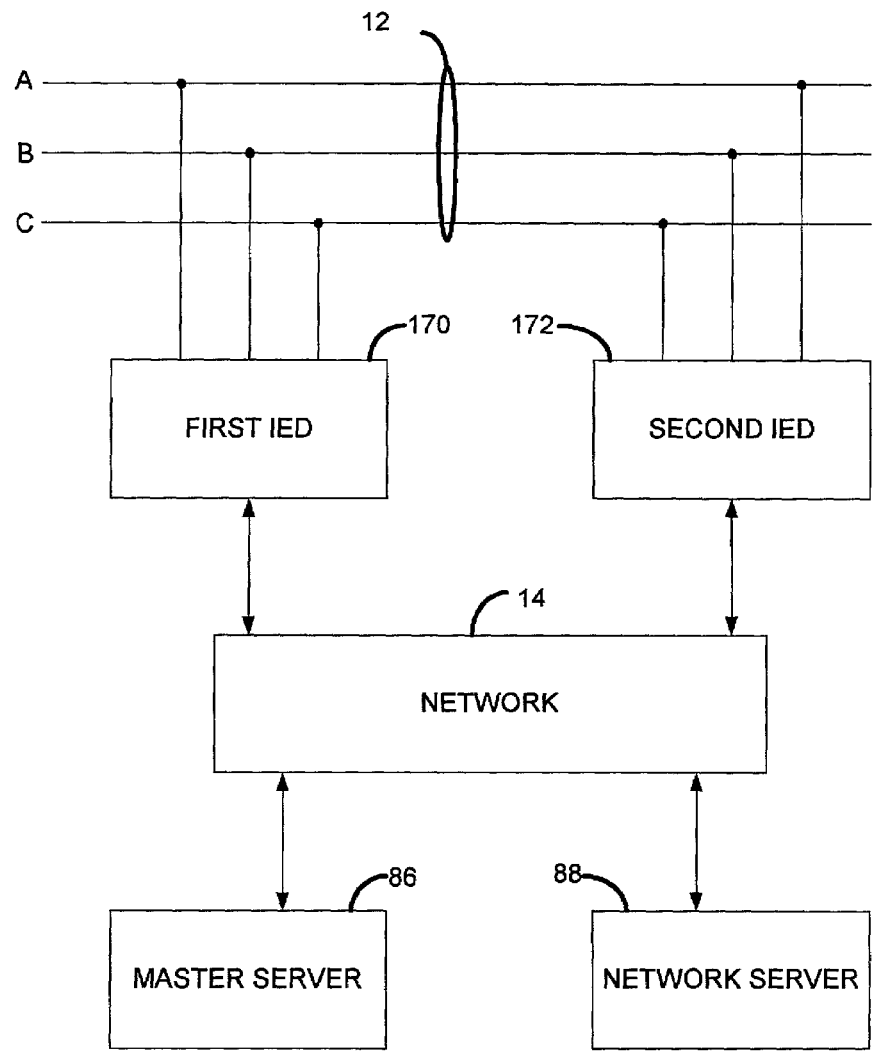
FIG. 11 is a block diagram of another embodiment of a portion of a power distribution system that includes embodiments of the intelligent electronic device.

FIG. 11 illustrates another embodiment of a portion of a power distribution system 10. The power distribution system 10 includes the conductors 12, the network 14, the master server 86, the network server 88, a first IED 170 and a second IED 172 connected as illustrated. The first and second IEDs 170, 172 are similar in operation and functionality to the previously discussed IED 16, 100, 102, 104 (FIG. 1, 5 and 6). In addition, the conductors 12, the network 14, the master server 86 and the network server 88 maintain the same identifying numbers to illustrate similarity with the previous discussed embodiments of the same name and identifying number.

This embodiment involves maintenance, such as, for example, an upgrade or recalibration of the first IED 170, which is permanently installed and operating in the field. The second IED 172 may be installed on a temporary basis. The first IED 170 is required to be taken out of service to perform the upgrade or recalibration. To maintain continuous monitoring, the upgrade or recalibration may be performed using the master server 86 and/or the network server 88 and the network 14 in communication with the first and second IEDs 170, 172. It will be appreciated that the hardware and network components illustrated in FIG. 5 may be included as part of the operation of the network 14, the master server 86 and the network server 88. In this embodiment, the first IED 170 may be taken out of service for an extended period of time without lost data or the possibility of errors that are typically associated with this type of upgrade or recalibration. The presently preferred embodiments maintain the integrity and continuity of the data using the combination of the first IED 170 and the second IED 172 throughout the outage of the first IED 170.

Figure 12:
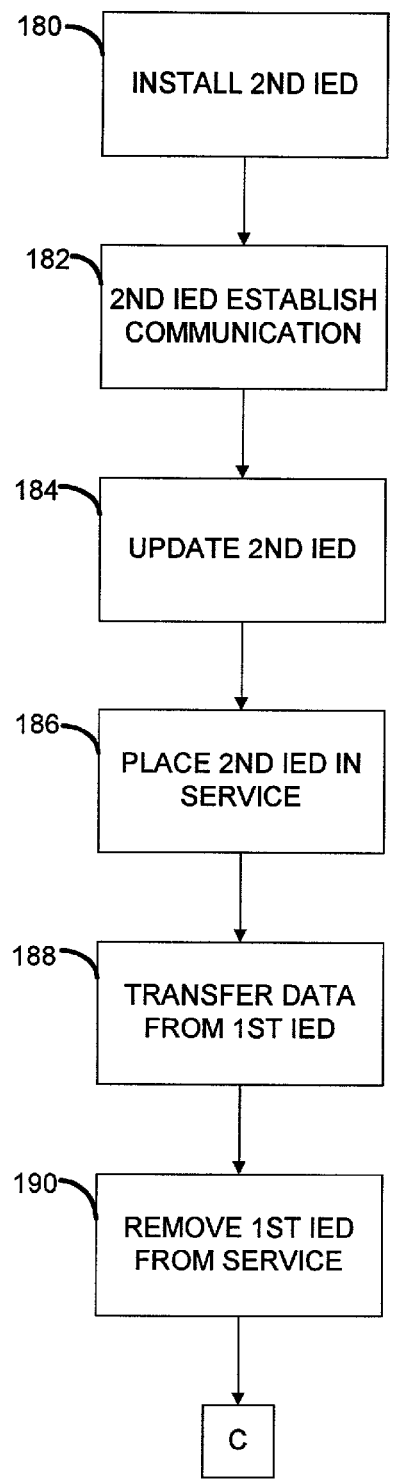
FIG. 12 is a first part of a flow diagram illustrating operation of the intelligent electronic devices illustrated in FIG. 11.

FIG. 12 is a flow diagram for the operation of the portion of the power distribution system illustrated in FIG. 10. The upgrade or reconfiguration begins at block 180 where the second IED 172 is installed by connection with the conductors 12 and the network 14. At block 182, the second IED 172 may establish communication with the master server 86 using the network 14. In addition, communication may include the network server 88. The data file that includes the software configuration of the first IED 170 is selected to generate an update for the software configuration of the second IED 172, at block 184. At block 186, the second IED 172 is placed in service with the same software configuration as the first IED 170 and begins collecting data. Prior to removing the first IED 170 from service, the data stored in the first IED 170 is transferred as a first data set to the master server 86 for storage using the network 14 at block 188. The transfer may also include use of the network server 88. The master server 86 stores the first data set as a function of the identifier associated with the first IED 170. At block 190, the first IED 170 is taken out of service for upgrade or recalibration.

Figure 13:
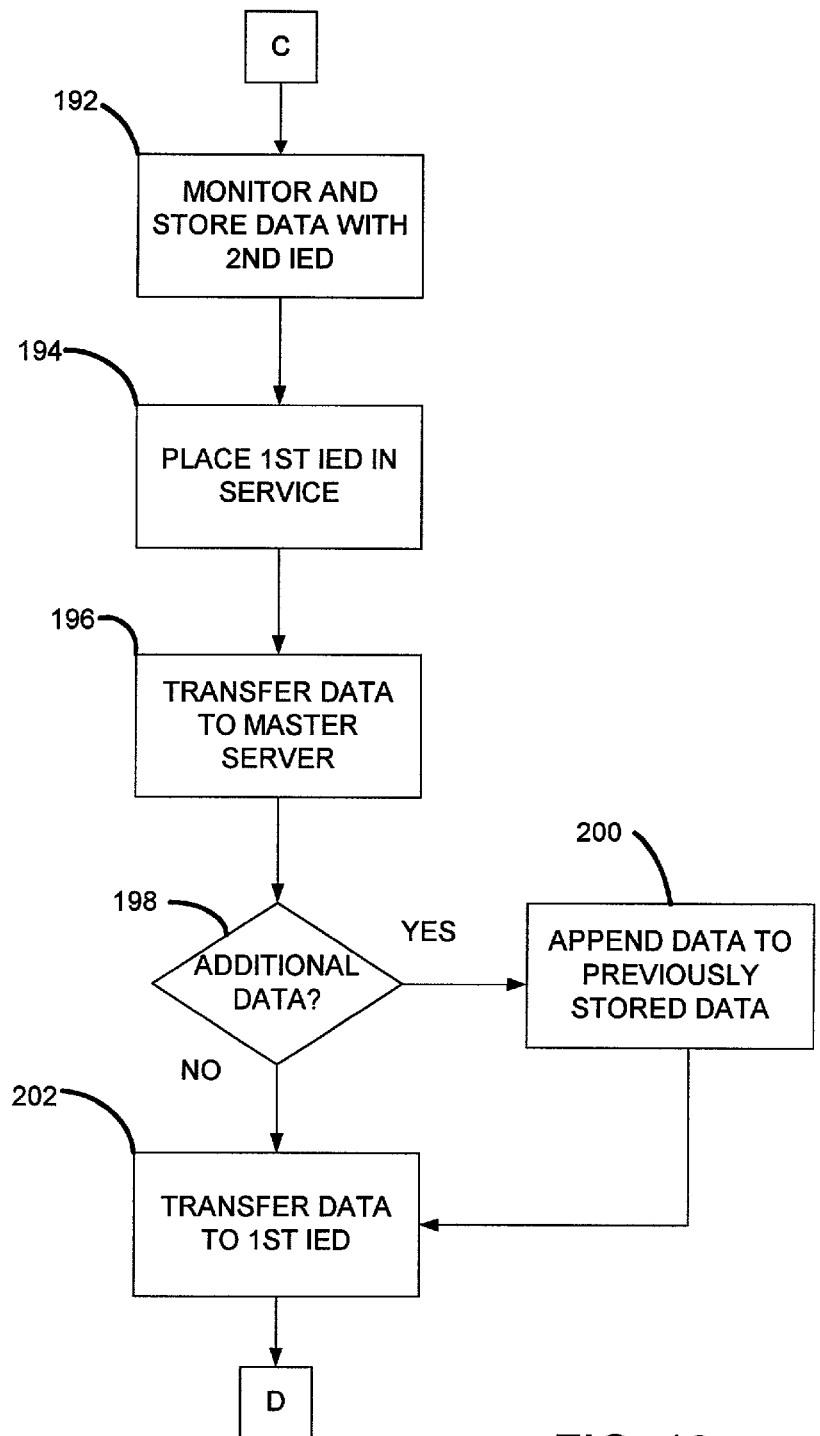
FIG. 13 is a second part of the flow diagram of FIG. 12.

Referring now to FIG. 13, the second IED 172 continues to monitor and store the electrical energy on the conductors 12 at block 192. The first IED 170 is placed back in service following completion of the maintenance at block 194. At block 196, the data collected by the second IED 172 is transferred to the master server 86 in the form of a second data set. The master server 86 checks the second data set to determine if data in addition to that from the previously stored first data set is present at block 198. If additional data is present, the additional data is appended to the data from the first IED 170 previously stored in the master server 86 at block 200. Alternatively, the master server 86 may maintain the first data set and the second data set separately. At block 202, the data stored in the master server 86 is transferred to the first IED 170. The transfer may be performed at the request of the first IED 170, by a user request made to the master server 86 and/or the network server 88 or any other previously discussed method to initiate the transfer. If at block 198, no additional data is transferred from the second IED 172, the data stored in master server 86 is transferred to the first IED 170 at block 202.

Figure 14:
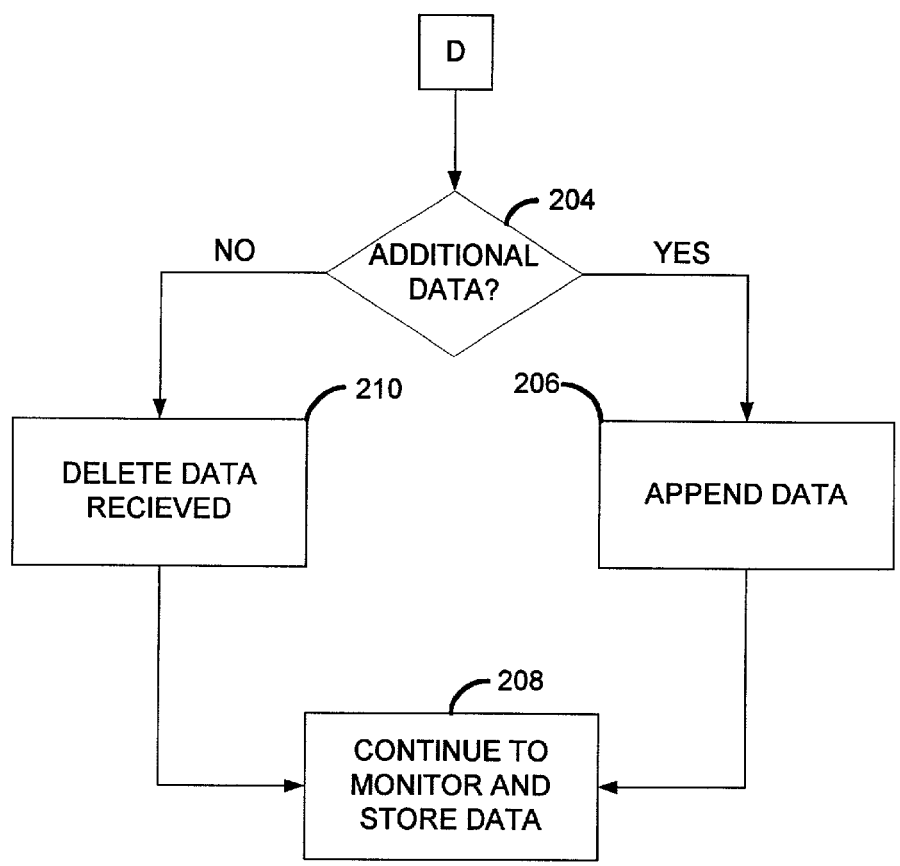
FIG. 14 is a third part of the flow diagram of FIG. 12.

Referring now to FIG. 14, the first IED 170, receives and analyze the data to determine if additional data to that currently stored in the first IED 170 exists at block 204. If additional data exists, the additional data is appended to the data stored in the first IED 170 at block 206. The additional data may be included in one combined data set from the database or may be the first data set and the second data set. At block 208, the first IED 170 continues to monitor and store data. If no additional data exists in the data received at block 204, the first IED 170 deletes the data received at block 210. At block 208, the first IED 170 continues to monitor and store data.

In another embodiment, the first IED 170 may be removed from service for maintenance and physically replaced by the second IED 172 on a temporary basis. In other words, the second IED 172 may be connected in place of the first IED 170. The data contained in the first IED 170 is transferred to the database 92 (FIG. 5) as a first data set prior to removal.

The second IED 172 may installed in place of the first IED 170 and operated to save data in a similar fashion to the first IED 170 as previously discussed. The data collected by the second IED 172 may be transferred to the database 92 in a second data set prior to removal from service. The first IED 170 may be installed in place of the second IED 172 and returned to service following completion of the maintenance. The combination of the first data set and the data set may be transferred to the first IED 170 as in the previously discussed embodiments. In this embodiment, data would be lost for the period of time when the first and second IEDs 170, 172 are being connected and disconnected. However, the data collected by the first and second IEDs 170, 172 may be error free and readily accessible from the single location of the first IED 170.

In yet another embodiment, the database 92 may reside within the second IED 172. As such, the first IED 170 communicates with the second IED 172 via the network 14 to transfer data for storage in the database 92. In addition, the data from the second IED 172 may be stored in the database 92. Following completion of the maintenance, when the first IED 170 is returned to service, the data from the first and second IEDs 170, 172 may be transferred over the network from the second IED 172 to the first IED 170.

The previously discussed embodiments allow a user to track, retrieve and modify the software configuration of one or more IEDs 16 that are currently installed and operating. In addition, the update of the software configuration currently operating in one or more of the IEDs 16 may occur in an automated fashion. Transfer of the updates to one or more IEDs 16 may occur as a function of a request from the IED 16 itself, the user of the IED 16 or the manufacturer of the IED 16. Further, the versatility in monitoring with one or more of the IEDs 16 may be improved due to the relative ease of upgrading or modifying the functionality through changes to the software configuration during operation. Accordingly, the user of the IEDs 16 may maintain better control of the currently operating software configurations as well as easily and efficiently perform reconfiguration and upgrade.

While the invention has been described above by reference to various embodiments, it will be understood that many changes and modifications can be made without departing from the scope of the invention. It is therefore intended that the foregoing detailed description be understood as an illustration of the presently preferred embodiments of the invention, and not as a definition of the invention. It is only the following claims, including all equivalents, which are intended to define the scope of this invention.

What is claimed is:

1. A method of modifying the operation of an intelligent electronic device installed in the field, the method comprising:

operating the intelligent electronic device with a software configuration to monitor electrical energy;

accessing a datafile of the intelligent electronic device with a virtual meter site via a network, wherein the datafile is stored external to the intelligent electronic device;

verifying that a copy of the software configuration in the datafile matches the software configuration operable in the intelligent electron i.e. device;

selecting modifications of the software configuration in the datafile with the virtual meter site; and revising the software configuration operable in the intelligent electronic device over the network with the virtual meter site as a function of the selected modifications of the software configuration in the datafile.

2. The method of claim 1, where revising the software configuration comprises:
generating an update;
transferring the update over the network to the intelligent electronic device; and
applying the update to the software configuration.

3. The method of claim 1, further comprising initiating revision of the software configuration with an email message.

4. The method of claim 1, further comprising initiating revision of the software configuration with the intelligent electronic device.

5. The method of claim 4, wherein initiating revision is performed as a function of a predetermined schedule.

6. The method of claim 3, further comprising initiating revision of the software configuration with the virtual meter site.

7. The method of claim 6, where initiating revision comprises triggering the initiation of the revision with activities of a user of the virtual meter site.

8. The method of claim 1, where selecting modifications comprises selecting modifications from a selection list on a display page.

9. The method of claim 1, where selecting modifications comprises answering a series of interrogatories on an interactive page.

10. The method of claim 9, where revising the software configuration comprises modifying the software configuration as a function of the answers.

11. The method of claim 1, where revising the software configuration comprises adding a module to the software configuration, wherein the module comprises a plurality of logic tasks that represent additional functionality to be added to one or more software applications executable with the intelligent electronic device.

12. The method of claim 1, where revising the software configuration comprises at least one of adding or modifying a framework within the software configuration, or combinations thereof, wherein the framework is representative of the functionality of one or more parts of application software that is executable with the intelligent electronic device.

13. The method of claim 1, where revising the software configuration comprises revising the firmware within the software configuration, wherein the firmware is operating code executable to provide basic functionality of the intelligent electronic device.

14. The method of claim 1, where revising the software configuration comprises:
accessing a software design tool over the network; and
modifying the software configuration with the software design tool.

15. The method of claim 1, wherein operating the intelligent electronic device comprises:
applying power to the intelligent electronic device;
executing a first portion of the software configuration that is stored in the intelligent electronic device;
retrieving a second portion of the software configuration from elsewhere in the network as a function of instructions within the first portion of the software configuration; and
executing the first and second portions of the software configuration within the intelligent electronic device.

16. The method of claim 1, where verifying that a copy of the software configuration in the data file matches the software configuration operable in the intelligent electronic device comprises retrieving the software configuration operable in the intelligent electronic device from the intelligent electronic device with the virtual meter site to perform the verification with the virtual meter site.

17. A method of modifying the configuration of an intelligent electronic device installed in the field, the method comprising:
applying power to the intelligent electronic device;
executing a first portion of a software configuration stored in the intelligent electronic device;
retrieving a second portion of the software configuration from elsewhere in a network as a function of instructions within the first portion of the software configuration:
combining the first and second portions of the software configuration to form a first software configuration:
operating the intelligent electronic device with the first software configuration to monitor electrical energy;
communicating over the network to modify a duplicate copy of the first software configuration stored external to the intelligent electronic device in a database;
generating a first software revision as a function of the modification of the duplicate copy;
initiating transfer of the first software revision over the network to the intelligent electronic device;
updating the first software configuration with the first software revision to create a second software configuration; and
operating the intelligent electronic device with the second software configuration.

18. The method of claim 17, wherein updating the first software configuration comprises creating the second software configuration within the intelligent electronic device while the intelligent electronic device monitors substantially continuously using the first software configuration.

19. The method of claim 18, wherein operating the intelligent electronic device with the second software configuration comprises substantially instantaneously switching from the first software configuration to the second software configuration.

20. The method of claim 17, further comprising saving the second software configuration in the intelligent electronic device.

21. The method of claim 17, farther comprising:
modifying the second software configuration with the intelligent electronic device to generate a third software configuration;
operating the intelligent electronic device with the third software configuration; and
initiating transfer of the third software configuration over the network to the database.

22. The method of claim 21, wherein modifying the second software configuration comprises the intelligent electronic device monitoring substantially continuously using the second software configuration while the second software configuration is being modified.

23. The method of claim 17, wherein communicating over the network to modify the copy of the first software configuration comprises performing verification to ensure authority to access the first software configuration.

24. The method of claim 17, wherein generating a first software revision comprises generating an update, the update comprising at least one of a modified version of the first software configuration, a modified framework for the first software configuration, modified firmware for the first software configuration or an enabling mechanism for the first software configuration, or combinations thereof.

25. The method of claim 17, wherein communicating over the network to modify the copy of the first software configuration comprises identifying the intelligent electronic device by an identifier.

26. The method of claim 25, further comprising:
requesting the first software configuration from the intelligent electronic device;
transferring the first software configuration over the network; and
verifying that the first software configuration matches the copy of the first software configuration.

27. The method of claim 17, wherein updating the first software revision comprises notifying a system administrator of the pending update.

28. The method of claim 17, wherein communicating over the network to modify the copy of the first software configuration comprises performing modifications with a virtual meter site.

29. The method of claim 28, further comprising communicating over the network with a browser.

30. The method of claim 17, wherein communicating over the network comprises transferring the first software configuration currently in operation in the intelligent electronic device over the network to a server, and comparing the first software configuration currently in operation in the intelligent electronic device to a datafile.

31. The method of claim 30, wherein generating a first software revision comprises modifying the datafile as a function of the modification specified.

32. The method of claim 17, wherein updating the first software configuration comprises accessing an enabling mechanism within the intelligent electronic device.

33. A method of modifying the functionality of a plurality of intelligent electronic devices installed and operating in the field, the method comprising:
accessing a virtual meter site via a network;
specifying an identifier for a group of intelligent electronic devices that are accessible by the virtual meter site over the network;
accessing with the virtual meter site a database having stored therein a data file of each of the intelligent electronic devices in the group, wherein the data file of each of the intelligent electronic devices in the group is associated with the identifier and is indicative of a current software configuration operable in a corresponding intelligent electronic device;
contacting each of the intelligent electronic devices in the group of intelligent electronic devices with the virtual meter site to verify that the current software configuration indicated with the data file matches the software configuration currently operable in each of the intelligent electronic devices in the group of intelligent electronic devices;
with the identifier, initiating the creation of group update to the software configuration of all of the intelligent electronic devices in the group with the virtual meter site once it is verified that to indicated current software configuration and the software configuration currently operable in each of the intelligent electronic devices in the group of intelligent electronic devices match;
transferring the update to each of the corresponding intelligent electronic devices in the group over the network; and
modifying the software configuration in each of the intelligent electronic devices with the update.

34. The method of claim 33, further comprising continuously monitoring with the intelligent electronic devices.

35. The method of claim 33, transferring the update comprises initiating the transfer with the intelligent electronic device.

36. The method of claim 33, transferring the update comprises initiating the transfer with the virtual meter site.

37. The method of claim 33, wherein transferring the update comprises simultaneously transferring the update to each of the intelligent electronic device.

38. The method of claim 33, wherein the update comprises at least one of a modified version of the software configuration, a modified framework for the software configuration, modified firmware for the software configuration or an enabling mechanism for the software configuration, or combinations thereof.

39. The method of claim 33, wherein initiating the creation of an update comprises:
accessing a database for the intelligent electronic devices over the network as a function of the identifier;
modifying the database over the network; and
generating the update as a function of the modification to the database.

40. The method of claim 33, wherein accessing the virtual meter site comprises accessing a server over the network.

41. The method of claim 40, further comprising accessing the server with a browser.

42. The method of claim 33, further comprising receiving status messages over the network during the transfer of the update and the modification of the software configuration.

43. The method of claim 33, wherein transferring the update comprises:
transferring the update over the network to a master intelligent electronic device; and
transferring the update over the network to the intelligent electronic devices with the master intelligent electronic device.

44. The method of claim 33, wherein transferring the update comprises:
transferring the update over the network to a translation device; and
transferring the update over the network to the intelligent electronic devices with the translation device.

45. The method of claim 33, further comprising accessing via the network a stored log of information indicating the status of the acts of transferring the update and modifying the software configuration for each of the intelligent electronic devices.

46. The method of claim 33, further comprising;
evaluating the modification to the software configuration of at least one intelligent electronic device via the network; and
communicating over the network to revert to the software configuration operating in the at least one intelligent electronic device prior to modification of the software configuration.

47. The method of claim 33, wherein the current software configuration operable in each of the intelligent electronic devices is stored in a memory included in each of the intelligent electronic devices, the memory comprising volatile memory and non-volatile memory, wherein a first portion of the software configuration is stored in the non-volatile memory and a second portion of the software configuration is stored in the volatile memory.

48. The method of claim 47, further comprising, upon startup of each of the intelligent electronic devices, executing the first portion of the software configuration stored in the non-volatile memory, and transferring the second portion of the software configuration over the network to the intelligent electronic device for storage in the volatile memory as a function of execution of the first portion of the software configuration.

49. A system for modifying the functionality of an intelligent electronic device previously installed in the field and operating, the system comprising:
a server computer, the intelligent electronic device in communication with the server over a network, the intelligent electronic device operated with a software configuration stored therein;
wherein the software configuration is stored in a memory of the intelligent electronic device comprising volatile memory and non-volatile memory, wherein a first portion of the software configuration is stored in the non-volatile memory and a second portion of the software configuration is stored in the volatile memory; and
a storage device in communication with the server, the storage device comprising a database, wherein a copy of the software configuration is stored in the database, the server is operable to modify the operation of the intelligent electronic device as a function of modifications to the copy of the software configuration stored in the database.

50. The system of claim 49, wherein the server comprises a network server operatively communicating with a master server, the network server operable to generate display pages to create a virtual meter site and the master server operable to maintain the database.

51. The system of claim 49, wherein the server comprises a second intelligent electronic device operatively communicating over the network.

52. The system of claim 49, further comprising a browser coupled to the server, the browser operable to access the database.

53. The system of claim 49, wherein the software configuration comprises firmware and frameworks.

54. The system of claim 53, wherein the server is operable to perform modifications to the firmware and frameworks as a function of selections lists selectable by a user.

55. The system of claim 49, wherein the network comprises an Intranet.

56. The system of claim 49, wherein the network comprises an Internet Protocol based network.

57. The system of claim 49, wherein the network further comprises an Internet.

58. The system of claim 49, wherein the intelligent electronic device comprises a watt-hour meter.

59. The system of claim 49, wherein the intelligent electronic device comprises a var-hour meter.

60. The system of claim 49, wherein the second portion of the software configuration is transferable over the network from the database to the intelligent electronic device as a function of instructions within the first portion of the software configuration.

61. The system of claim 49, wherein the server is operable to modify the operation of the intelligent electronic device with an update transferable over the network to the intelligent electronic device.

62. The system of claim 61, wherein the update comprises a modified software configuration.

63. The system of claim 61, wherein the update comprises a modification to the software configuration.

64. The system of claim 61, wherein the update comprises an enabling mechanism.

65. The system of claim 61, wherein the update comprises an email message.

66. The system of claim 61, wherein the update comprises a datafile.

67. A system for modifying the functionality of an intelligent electronic device previously installed in the field and operating, the system comprising:
a server computer in communication with the intelligent electronic device over a network;
a database accessible by the server computer, wherein the database is configured to store a copy of a software configuration operable in the intelligent electronic device;
the intelligent electronic device operable upon power up to execute a first portion of the software configuration stored in a memory of the intelligent electronic device, and to retrieve from over the network a second portion of the software configuration as a function of execution of the first portion of the software configuration;
wherein the intelligent electronic device is further operable to store the second portion of the software configuration in the memory to form the software configuration that is operable in the intelligent electronic device; and
wherein the server computer is further operable to generate and transmit to the intelligent electronic device a software revision of the software configuration that is operable by the intelligent electronic device in response to a modification of the software configuration storable in the database.

68. The system of claim 67, wherein the memory included in the intelligent electronic device comprises a volatile portion and a non-volatile portion, and the first pardon of the software configuration is storable in the non-volatile portion, and the second portion of the software configuration is storable in the volatile portion.

69. The system of claim 67, wherein the server computer, prior to generation and transmittal of the software revision, is further operable to communicate with the intelligent electronic device over the network to verify that the software configuration that is operable in the intelligent electronic device matches the copy of the software configuration storable in the database.

70. The system of claim 67, wherein the intelligent electronic device is further operable to retrieve the second portion of the software configuration from the database via the server computer.

71. A method of modifying the configuration of an intelligent electronic device installed in the field, the method comprising:
operating the intelligent electronic device with a software configuration to monitor electrical energy;
communicating over a network to modify a duplicate copy of the software configuration stored external to the intelligent electronic device in a database;
transferring the software configuration currently in operation in the intelligent electronic device over the network to verify that the duplicate copy of the software configuration matches the software configuration currently in operation in the intelligent electronic device;
after verification is successful, receiving with the intelligent electronic device a first software revision in response to modification of the duplicate copy of the software configuration;
updating the software configuration currently in operation in the intelligent electronic device with the first software revision to create a revised software configuration; and
operating the intelligent electronic device with the revised software configuration.

* * * * *

UNITED STATES PATENT AND TRADEMARK OFFICE
CERTIFICATE OF CORRECTION

PATENT NO. : 7,085,824 B2
APPLICATION NO. : 09/792701
DATED : August 1, 2006
INVENTOR(S) : J. Bradforth Forth Page 1 of 1

It is certified that error appears in the above-identified patent and that said Letters Patent is hereby corrected as shown below:

Column 22, line 63, change "electron i.e." to --electronic--

Column 23, line 17 change "3" to --1--

Column 24, line 44, "farther" to --further--

Column 26, line 8, change "device" to --devices--

Column 28, line 29, change "pardon" to --portion--

Signed and Sealed this

Fifth Day of December, 2006

JON W. DUDAS
*Director of the United States Patent and Trademark Office*

UNITED STATES PATENT AND TRADEMARK OFFICE
CERTIFICATE OF CORRECTION

PATENT NO.         : 7,085,824 B2
APPLICATION NO.    : 09/792701
DATED              : August 1, 2006
INVENTOR(S)        : J. Bradford Forth et al.

It is certified that error appears in the above-identified patent and that said Letters Patent is hereby corrected as shown below:

In column 1, line 16, delete "09/791,421" and substitute --09/792,699-- in its place.

Signed and Sealed this

First Day of September, 2009

David J. Kappos
*Director of the United States Patent and Trademark Office*